United States Patent
Kaneda et al.

(10) Patent No.: US 8,143,533 B2
(45) Date of Patent: Mar. 27, 2012

(54) METHOD FOR FORMING RESIST PATTERN, METHOD FOR PRODUCING CIRCUIT BOARD, AND CIRCUIT BOARD

(75) Inventors: Yasuo Kaneda, Tokyo (JP); Munetoshi Irisawa, Tokyo (JP); Yuji Toyoda, Tokyo (JP); Toyokazu Komuro, Tokyo (JP); Katsuya Fukase, Nagano (JP); Toyoaki Sakai, Nagano (JP)

(73) Assignees: Mitsubishi Paper Mills Limited, Tokyo (JP); Shinko Electric Industries Co., Ltd., Nagano-shi (JP)

( * ) Notice: Subject to any disclaimer, the term of this patent is extended or adjusted under 35 U.S.C. 154(b) by 680 days.

(21) Appl. No.: 12/227,377

(22) PCT Filed: May 17, 2006

(86) PCT No.: PCT/JP2006/309851
§ 371 (c)(1),
(2), (4) Date: Nov. 14, 2008

(87) PCT Pub. No.: WO2007/132533
PCT Pub. Date: Nov. 22, 2007

(65) Prior Publication Data
US 2009/0236137 A1    Sep. 24, 2009

(51) Int. Cl.
*H05K 1/03* (2006.01)
(52) U.S. Cl. .................. 174/262; 430/314
(58) Field of Classification Search ......... 174/262
See application file for complete search history.

(56) References Cited

U.S. PATENT DOCUMENTS

| | | | |
|---|---|---|---|
| 5,858,816 A | 1/1999 | Sato et al. | |
| 7,404,908 B2 | 7/2008 | Yamaoka | |
| 7,434,311 B2 | 10/2008 | Koizumi | |
| 2006/0084011 A1* | 4/2006 | Yamaoka | 430/313 |
| 2006/0257793 A1 | 11/2006 | Koizumi | |
| 2007/0181994 A1* | 8/2007 | Fukase et al. | 257/700 |

FOREIGN PATENT DOCUMENTS

| | | | |
|---|---|---|---|
| JP | 01-099282 A | 4/1989 | |
| JP | 04-062893 A | 2/1992 | |
| JP | 5-152748 A | 6/1993 | |
| JP | 5-235543 A | 9/1993 | |
| JP | 07-007265 A | 1/1995 | |
| JP | 10-178031 A | 6/1998 | |
| JP | 2004-303856 A | 10/2004 | |
| JP | 2005286295 A | * 10/2005 | |
| JP | 2006-135301 A | 5/2006 | |
| JP | 2006-173597 A | 6/2006 | |
| JP | 2006-344921 A | 12/2006 | |
| WO | WO-2005/086552 A1 | 9/2005 | |

* cited by examiner

*Primary Examiner* — Xiaoliang Chen
*Assistant Examiner* — Nathan Milakovich
(74) *Attorney, Agent, or Firm* — Birch, Stewart, Kolasch & Birch, LLP

(57) ABSTRACT

There are provided a method for forming a resist pattern for preparing a circuit board having a landless or small-land-width through-hole(s) to realize a high-density circuit board, a method for producing a circuit board, and a circuit board. A method for forming a resist pattern, comprising the steps of forming a resin layer and a mask layer on a first surface of a substrate having a through-hole(s), and removing the resin layer on the through-hole(s) and on a periphery of the through-hole(s) on the first surface by supplying a resin layer removing solution from a second surface opposite to the first surface of the substrate, and a method for producing a circuit board using the method for forming a resist pattern, and a circuit board.

4 Claims, 18 Drawing Sheets (a)

(b)

(c)

(a)

(b)

(c)

(a)

(b)

(a)            (b)

(a)  (b)

METHOD FOR FORMING RESIST PATTERN, METHOD FOR PRODUCING CIRCUIT BOARD, AND CIRCUIT BOARD

BACKGROUND OF THE INVENTION

1. Field of the Invention

The present invention relates to a method for forming a resist pattern, a method for producing a circuit board, and a circuit board. More specifically, the present invention relates to a method for forming a landless or small-land-width resist pattern suitable for realizing a high-density circuit board and a fine wiring pattern on a circuit board, a method for producing a circuit board, and a circuit board.

2. Description of the Related Art

As electronic equipment has been reduced in size and provided with multiple functions in recent years, a high-density circuit board and a fine wiring pattern on a circuit board have also been realized. A means for achieving such conditions is a multilayer circuit board. As shown in FIG. 45, in a circuit board formed by stacking multiple wiring layers, the layers are conducted to each other through a pore such as a through-hole or a non-through-hole (hereinafter collectively called "hole") having an inner wall covered with a conductive layer or being filled with a conductive layer, which is generally called a through-hole 31, a via hole 32 or an interstitial via hole 33.

FIG. 46 is a schematic view of a through-hole from above. A conductive layer called a land 18 is formed around a through-hole 3. There are various types of lands such as square, round, oval and deformed lands. A round land is often used in terms of occupied area and easiness in designing. A landless or small-land-width through-hole is needed for a high-density circuit board. Here, the land width (Lw) means a minimum width of an annular conductor around a through-hole in the case of a round land. When the diameter of a through-hole when the hole is formed is $D_0$ and the diameter of an annular conductor of a round land is D, the term "landless" means a land width $Lw=(D-D_0)/2$ of 0 and the term "small-land-width" means a land width $Lw=(D-D_0)/2$ of more than 0 and 40 µm or less.

A subtractive method, an additive method and a semi-additive method are known as a method for producing a circuit board. The additive method is a method of providing a plating resist layer in a non-circuit part on the surface of an insulating substrate and forming a conductive layer in a part corresponding to a circuit part by electroless plating or the like. The method is advantageous for forming a fine circuit; however, since all conductive layers are formed by electroless plating, the production cost is high, disadvantageously.

The semi-additive method is a method of providing a plating resist layer in a non-circuit part of an insulating substrate having a thin conductive layer on the surface, forming a conductive layer in a part corresponding to a circuit part by electrolytic plating, removing the plating resist layer in the non-circuit part, and then removing the thin conductive layer in the non-circuit part by flash etching to form a circuit. Since electrolytic plating enabling high-speed operation can be used, the method can be advantageously used as a method for forming a fine circuit. The production cost is lower than that of the additive method. However, it is difficult to form all wiring patterns with a uniform thickness by electrolytic plating, and quality management is difficult, disadvantageously.

The subtractive method is a method of providing an etching resist layer in a circuit part of an insulating layer provided with a conductive layer on the surface, and removing the uncovered conductive layer in a non-circuit part by etching to form a circuit. Since an image is weakened by side etching of a conductive layer, for example, the method has limitations as compared with the other two methods in terms of formation of a fine circuit. However, the method can prepare a circuit board by simple treatment, has high productivity, has the lowest production cost, and is most widely used.

An etching resist layer and a plating resist layer are formed by screen printing, photofabrication having an exposure development step using a photosensitive material, inkjet printing or the like. In production of a landless or small-land-width hole, it is important to perform alignment in a step such as hole forming, screen printing, an exposure step or inkjet printing. In particular, a landless or small-land-width hole required for a high-density circuit board needs extremely high alignment accuracy. Most desirably, a land has a uniform width in all directions of a hole, that is, a hole and a land are concentric circles. When alignment is inaccurate, a hole and a land are not concentric circles, disadvantageously.

An example of a method for producing a circuit board by the semi-additive method will be described. First, a through-hole 3 (FIG. 48) is opened on an insulating substrate 1 (FIG. 47), and a thin first conductive layer 12 is provided on the surface including an inner wall of the through-hole (FIG. 49). Then, a plating resist layer 36 is formed in a non-circuit part (FIG. 50). Subsequently, a second conductive layer 13 is formed on the surface of a part on which the first conductive layer 12 is uncovered by electrolytic plating (FIG. 51). Thereafter, the plating resist layer 36 is removed (FIG. 52), and the thin first conductive layer 12 under the plating resist layer 36 is removed by flash etching to form a circuit board (FIG. 53).

A plating resist layer is formed by photofabrication for a high-density circuit board. The photofabrication is generally a method using a negative (photocrosslinkable) or positive (photodegradable) photoresist. In the semi-additive method, since a second conductive layer is provided on the inner wall of a through-hole by electrolytic plating, it is necessary that a plating resist layer does not remain on the through-hole and on the inner wall of the through-hole.

When a negative (photocrosslinkable) dry film photoresist is used, a through-hole and a land are shielded by a shielding part 42 as shown in FIG. 54 to prevent crosslinking of a negative (photocrosslinkable) dry film photoresist 38, and the unreacted dry film photoresist is removed so that the plating resist layer is not present on the through-hole and the land. In these steps, alignment in through-hole forming or an exposure step is important. In particular, a landless or small-land-width through-hole required for a high-density circuit board needs extremely high alignment accuracy.

For example, when the land width is large as shown in FIG. 55(b), even if misalignment occurs by a distance x during alignment of an exposure mask, a through-hole is completely shielded and a negative (photocrosslinkable) dry film photoresist is not crosslinked. However, when the land width is small as shown in FIG. 55(a), if misalignment occurs by the same distance x during alignment of an exposure mask, a through-hole is placed out of a land, making it impossible to form a narrow land on the whole outer periphery of the through-hole, disadvantageously.

For production of a landless through-hole, there is known a method of providing a shielding part 42 as shown in FIG. 56 so that only the center on a through-hole of a negative (photocrosslinkable) dry film photoresist 38 is not exposed, and allowing a plating resist layer 36 to protrude toward the center on the through-hole as shown in FIG. 57, to increase the tolerance of alignment accuracy (e.g. Patent Document 1). When a through-hole 3 has a large diameter as shown in FIG. 58(b), a part of the through-hole 3 is shielded even if a shielding part 42 is misaligned by a distance y. However, when a through-hole has a small diameter as shown in FIG. 58(a), a shielding part 42 is placed out of the through-hole 3 if the shielding part 42 is misaligned by the same distance y. Therefore, a negative (photocrosslinkable) dry film photoresist 38 on the through-hole is crosslinked, and a plating resist layer 36 on the through-hole is not removed, disadvantageously.

Actually, there are limitations to alignment accuracy due to forming hole accuracy, stretching of a substrate, a change in dimension of an exposure photomask, and the like. Through-holes having various diameters are formed on a high-density circuit board, and the number of the holes is also extremely large. Therefore, it is extremely difficult to perform accurate alignment for all through-holes. Accordingly, although a landless or small-land-width through-hole is needed for a high-density circuit board, a small-land-width through-hole must be designed to have a large land width so that the through-hole is surely shielded and a negative (photocrosslinkable) dry film photoresist is not crosslinked, disadvantageously (e.g. Patent Document 2). In a landless through-hole, a shielding part must be designed to be small so that the through-hole is surely shielded and a negative (photocrosslinkable) dry film photoresist is not crosslinked. For this reason, it is difficult for a plating solution to enter the through-hole and plating is not performed, disadvantageously.

A method using an electrodeposition photoresist is also known as a method for forming a plating resist layer. This is a method of forming an electrodeposition photoresist layer uniformly on a conductive layer including the inner wall of a through-hole by electrodeposition coating and then developing the layer by exposure through a photomask to provide a plating resist layer.

An electrodeposition photoresist may be negative (photocrosslinkable) or positive (photodegradable). A positive (photodegradable) electrodeposition photoresist must be degraded by exposure; however, the inside of a columnar through-hole cannot be completely exposed. Therefore, the electrodeposition photoresist in the through-hole cannot be completely degraded and cannot be used as a plating resist layer.

On the other hand, a negative (photocrosslinkable) electrodeposition photoresist is said to be effective as a means for forming a landless through-hole using a photomask having only a landless pattern, since it is not necessary to expose the inside of a through-hole. Since light does not enter a columnar through-hole, it is possible to remove a negative (photocrosslinkable) photoresist layer on the inner wall of the through-hole. However, when the corner of a through-hole has a tapered shape, light partially enters the through-hole, and a plating resist layer on the inner wall of the through-hole cannot be entirely removed, disadvantageously.

When a circuit board is produced by the subtractive method, a conductive layer provided on the inner wall of a hole must be protected by an etching resist layer, so that the conductive layer on the inner wall of the hole is not removed in an etching step. When the etching resist layer is formed using a negative (photocrosslinkable) dry film photoresist, the conductive layer on the inner wall of the hole is protected by tenting, in which a hole and a land are exposed to cover the hole with a crosslinked dry film photoresist, so that an etchant does not enter the hole.

When a hole is protected by tenting, alignment in hole forming or an exposure step is important. In particular, a landless or small-land-width hole required for a high-density circuit board needs extremely high alignment accuracy. Specifically, when the land width is large as shown in FIG. 55(b), a resist cover can be completely formed on a hole even if misalignment occurs by a distance x. However, when the land width is small as shown in FIG. 55(a), if a hole is misaligned from a land by the same distance x, the land is placed out of the hole and an etchant enters the hole, resulting in conduction failure, disadvantageously. However, there are limitations to alignment accuracy due to forming hole accuracy, stretching of a substrate, a change in dimension of an exposure photomask, and the like, actually. Holes having various diameters are formed on a high-density circuit board, and the number of the holes is also extremely large. Therefore, it is extremely difficult to perform accurate alignment for all holes. Accordingly, although a landless or small-land-width hole is needed for a high-density circuit board, the land width must be designed to be large to surely perform tenting, disadvantageously.

Regarding thickness of a dry film photoresist, to perform tenting more surely, the dry film photoresist must be thick for forming a stronger tent. When a surface wiring pattern is formed by etching in the subtractive method, if an etching resist layer formed by a dry film photoresist is thick, an etchant infiltrates poorly during etching and a fine pattern cannot be formed, disadvantageously.

There has been proposed a method for producing a circuit board, which solves the problems of misalignment between a land and a hole caused by alignment and corresponds to a landless or small-land-width hole needed for a high-density circuit board (Patent Document 3). This is a technology of forming a first resin layer on a substrate having a hole, then forming a second resin layer on the surface of the first resin layer other than on the hole, and subsequently dissolving and removing the first resin layer on the hole using a first resin layer developer not dissolving the second resin layer to form an opening on the hole accurately. In this technology, a landless or small-land-width hole can be accurately formed. On the other hand, wet toner or the like is used to form a second resin layer. However, a developing apparatus for toner electrodeposition must be newly introduced for toner electrodeposition using wet toner, because the production cannot be performed only by an existing production apparatus. Accordingly, it is difficult to perform the method when there is no fund or installation space for introduction of new equipment. Even if the equipment can be introduced, management is required for performing stable toner electrodeposition, and there is a risk of a short circuit or disconnected circuit due to abnormal adhesion or insufficient adhesion of toner.

Generally, in a conventional circuit board, the surface of a substrate is covered with a solder resist and a through-hole is filled with the solder resist to prevent soldering of a land, a circuit conductive layer and the like except for a pad necessary for soldering and to maintain insulation properties of the circuit surface and protect the circuit conductive layer. In this case, when the top of a land conductive layer has an acute-angled shape, the top of the solder resist is extremely thin due to surface tension and curing shrinkage of the solder resist, disadvantageously.

Patent Document 1: Japanese Unexamined Patent Publication No. Hei 10-178031
Patent Document 2: Japanese Unexamined Patent Publication No. Hei 07-007265
Patent Document 3: WO 2005/086552

SUMMARY OF THE INVENTION

Problems to be Solved by the Invention

An objective of the present invention is to provide a method for forming a resist pattern and a method for producing a circuit board, which solve the problems of misalignment between a land and a hole caused by alignment and correspond to a landless or small-land-width hole needed for a high-density circuit board. In particular, the present invention provides a method for forming a resist pattern and a method for producing a circuit board, where a circuit board having a landless or small-land-width hole can be prepared by a series of steps in which a plugging ink step, a conductive ink filling step, an electrodeposition step, a metal plating step, a resist forming step and an etching step are appropriately combined, without requiring introduction of new equipment for toner electrodeposition or the like. The present invention further provides a method for forming a resist pattern, a method for producing a circuit board, and a circuit board, which can provide a solder resist favorably. In the present invention, the landless or small-land-width through-hole means such a through-hole as defined above.

Means for Solving the Problems

As a result of extensive studies to solve the above problems, the present inventors have found the following invention.
Method for Forming Resist Pattern A first aspect of the present invention is directed to a method for forming a resist pattern, comprising the steps of forming a resin layer and a mask layer on a first surface of a substrate having a through-hole(s) and removing the resin layer on the through-hole(s) and on a periphery of the through-hole(s) on the first surface by supplying a resin layer removing solution from a second surface opposite to the first surface of the substrate, The method for forming a resist pattern according to the first aspect of the invention, wherein the resin layer and the mask layer are integrally formed, The method for forming a resist pattern according to the first aspect of the invention, wherein the resin layer is a photocrosslinkable resin layer, and The method for forming a resist pattern according to the first aspect of the invention, wherein the substrate having a through-hole(s) is an insulating substrate having a conductive layer on the surface of the substrate and on the inner wall of a through-hole(s).
Method for Producing Circuit Board by Semi-Additive Method A second aspect of the present invention is directed to a method for producing a circuit board, comprising the steps of (a) preparing an insulating substrate having a through-hole(s), which has a first conductive layer on a first surface, on a second surface opposite to the first surface and on an inner wall of the through-hole(s), (b) covering the first conductive layer and an opening of the through-hole(s) on the first surface with a photocrosslinkable resin layer and a mask layer by forming the photocrosslinkable resin layer and the mask layer on the first surface, (c) uncovering the first conductive layer on the periphery of the through-hole(s) on the first surface by supplying a photocrosslinkable resin layer removing solution from the second surface and removing the photocrosslinkable resin layer on the through-hole(s) and on a periphery of the through-hole(s) on the first surface, (d) subjecting the photocrosslinkable resin layer on the first surface to pattern exposure, (e) covering the first conductive layer and an opening of the through-hole(s) on the second surface with a photocrosslinkable resin layer and a mask layer by forming the photocrosslinkable resin layer and the mask layer on the second surface, (f) removing the mask layer on the first surface, (g) uncovering the first conductive layer on the first surface and the first conductive layer on a periphery of the through-hole(s) on the second surface by supplying a photocrosslinkable resin layer removing solution from the first surface and removing an uncured photocrosslinkable resin layer on the first surface and the photocrosslinkable resin layer on the through-hole(s) and on the periphery of the through-hole(s) on the second surface, (h) subjecting the photocrosslinkable resin layer on the second surface to pattern exposure, (i) removing the mask layer on the second surface, (j) uncovering the first conductive layer on the second surface by supplying a photocrosslinkable resin layer removing solution from the second surface and removing an uncured photocrosslinkable resin layer on the second surface, (k) forming a second conductive layer on the first conductive layer uncovered on the inner wall of the through-hole(s) and the periphery of the through-hole(s) and on the first surface and the second surface by electrolytic plating, (l) uncovering the first conductive layer on the first surface and the second surface by removing the cured photocrosslinkable resin layers on the first surface and the second surface, and (m) removing the uncovered first conductive layer by flash etching in this order, The method for producing a circuit board according to the second aspect of the invention, wherein the step (f) is performed before the step (e), The method for producing a circuit board according to the second aspect of the invention, wherein the step (f) is performed before the step (d), and The method for producing a circuit board according to the second aspect of the invention, wherein the step (g) comprises the steps of (g1) uncovering the first conductive layer on the first surface by supplying the photocrosslinkable resin removing solution from the first surface and removing the uncured photocrosslinkable resin layer on the first surface and (g2) uncovering the first conductive layer on the periphery of the through-hole(s) on the second surface by supplying the photocrosslinkable resin removing solution from the first surface and removing the photocrosslinkable resin layer on the through-hole(s) and on the periphery of the through-hole(s) on the second surface, and the step (e) is performed between the step (g1) and the step (g2).
Circuit Board A third aspect of the present invention is directed to a circuit board comprising a land conductive layer formed on the periphery of a through-hole(s) of an insulating substrate having the through-hole(s), a circuit conductive layer constituting a circuit wiring on a surface of the insulating substrate, and a conductive layer on an inner wall of the through-hole(s), wherein an outer side surface of the land conductive layer in a part not connected to the circuit conductive layer has an inclination angle smaller than 90 degrees, The circuit board according to the third aspect of the invention, wherein the outer side surface of the land conductive layer in the part not connected to the circuit conductive layer has an inclination angle of 60 to 80 degrees, The circuit board according to the third aspect of the invention, wherein a difference between the diameter formed by the outer side surface of the land conductive layer and a diameter of the through-hole(s) when the hole(s) is formed is 0 to 80 μm, The circuit board according to the third aspect of the invention, wherein the inclination angle of the outer side surface of the land conductive layer in the part not connected to the circuit conductive layer is smaller than the inclination angle of the side surface of the circuit conductive layer, The circuit board according to the third aspect of the invention, wherein a side surface of the circuit conductive layer has the inclination angle of about 90 degrees, and The circuit board according to the third aspect of the invention, wherein the land conductive layer is formed concentrically with the through-hole(s).

Method for Producing Circuit Board by Subtractive Method—1

A fourth aspect of the present invention is directed to a method for producing a circuit board, comprising the steps of (A) preparing an insulating substrate having a through-hole(s), which has a conductive layer on a first surface, on a second surface opposite to the first surface and on an inner wall of the through-hole(s), (B) covering the conductive layer and an opening of the through-hole(s) on the first surface with a first resin layer and a mask layer by forming the first resin layer and the mask layer on the first surface, (C) uncovering the conductive layer on a periphery of the through-hole(s) on the first surface by supplying a first resin layer removing solution from the second surface and removing the first resin layer on the through-hole(s) and on the periphery of the through-hole(s) on the first surface, (D) providing a treatment for provision of resistance against a second resin layer removing solution to the resin layer on the first surface with, (E) removing the mask layer on the first surface, (F) covering the conductive layer and an opening of the through-hole(s) on the second surface with a second resin layer and a mask layer by forming the second resin layer and the mask layer on the second surface, (G) uncovering the conductive layer on a periphery of the through-hole(s) on the second surface by supplying a second resin layer removing solution from the first surface and removing the second resin layer on the through-hole(s) and on the periphery of the through-hole(s) on the second surface, and (H) removing the mask layer on the second surface in this order, A method for producing a circuit board, comprising the steps of (I) forming an etching resist layer on the uncovered conductive layer, (J) removing the first resin layer and the second resin layer, (K) forming photocrosslinkable resin layers on the first surface and the second surface, (L) photocrosslinking curing the photocrosslinkable resin layers on the first surface and the second surface in a pattern by pattern exposure, (M) uncovering the conductive layer in a pattern by removing uncured photocrosslinkable resin layers on the first surface and the second surface, (N) removing the uncovered conductive layer on the first surface and the second surface by etching with an etchant, and (O) removing the etching resist layer and the photocrosslinking cured photocrosslinkable resin layer, in this order, subsequently to the steps (A) to (H) according to the fourth aspect of the invention, The method for producing a circuit board according to the fourth aspect of the invention, wherein the first resin layer is a photocrosslinkable resin and the a treatment for provision of resistance is an exposure treatment, The method for producing a circuit board according to the fourth aspect of the invention, wherein the etching resist layer is a metal layer insoluble in the etchant for the conductive layer and is formed by pattern plating, The method for producing a circuit board according to the fourth aspect of the invention, wherein the step (E) is performed before the step (D), and The method for producing a circuit board according to the fourth aspect of the invention, wherein the step (E) is performed after the step (F).

Method for Producing Circuit Board by Subtractive Method—2

A fifth aspect of the present invention is directed to a method for producing a circuit board, comprising the steps of (α) preparing an insulating substrate having a through-hole(s), which has a conductive layer on a first surface, on a second surface opposite to the first surface and on an inner wall of the through-hole(s), (β) covering the conductive layer and an opening of the through-hole(s) on the first surface with a photocrosslinkable resin layer and a mask layer by forming the photocrosslinkable resin layer and the mask layer on the first surface, (γ) uncovering the conductive layer on a periphery of the through-hole(s) on the first surface by supplying a photocrosslinkable resin layer removing solution from the second surface and removing the photocrosslinkable resin layer on the through-hole(s) and on the periphery of the through-hole(s) on the first surface, (δ) photocrosslinking curing the photocrosslinkable resin layer on the first surface in a pattern by pattern exposure, (ε) covering the conductive layer and an opening of the through-hole(s) on the second surface with a photocrosslinkable resin layer and a mask layer by forming the photocrosslinkable resin layer and the mask layer on the second surface, (ζ) removing the mask layer on the first surface, (η) uncovering the conductive layer on the first surface and the conductive layer on a periphery of the through-hole(s) on the second surface by supplying a photocrosslinkable resin layer removing solution from the first surface and removing an uncured photocrosslinkable resin layer on the first surface and the photocrosslinkable resin layer on the through-hole(s) and on the periphery of the through-hole(s) on the second surface, (θ) photocrosslinking curing the photocrosslinkable resin layer on the second surface in a pattern by pattern exposure, (ι) removing the mask layer on the second surface, (κ) uncovering the conductive layer on the second surface by supplying a photocrosslinkable resin layer removing solution from the second surface and removing an uncured photocrosslinkable resin layer on the second surface, (λ) forming an etching resist layer on the conductive layer uncovered on the inner wall of the through-hole(s) and the periphery of the through-hole(s) and on the first surface and the second surface, (μ) uncovering the conductive layer on the first surface and the second surface by removing the photocrosslinking cured photocrosslinkable resin layers on the first surface and the second surface, (ν) removing the uncovered conductive layer by etching, and (ξ) removing the etching resist layer in this order;

The method for producing a circuit board according to the fifth aspect of the invention, wherein the step (ζ) is performed before the step (ε);

The method for producing a circuit board according to the fifth aspect of the invention, wherein the step (ζ) is performed before the step (δ); and The method for producing a circuit board according to the fifth aspect of the invention, wherein the step (η) comprises the steps of (η1) uncovering the conductive layer on the first surface by supplying a photocrosslinkable resin layer removing solution from the first surface and removing the uncured photocrosslinkable resin layer on the first surface and (η2) uncovering the conductive layer on the periphery of the through-hole(s) on the second surface by supplying a photocrosslinkable resin layer removing solution from the first surface and removing the photocrosslinkable resin layer on the through-hole(s) and on the periphery of the through-hole(s) on the second surface, and the step (ε) is performed between the step (η1) and the step (η2).

Effect of the Invention

Effect of Method for Forming Resist Pattern According to Present Invention

In the method for forming a resist pattern according to the first aspect of the present invention, a resin layer and a mask layer are provided on one surface (first surface) of a substrate having a through-hole(s) to plug the through-hole(s), and the resin layer on the through-hole(s) and on a periphery of the through-hole(s) is removed by a resin layer removing solution supplied from the opposite surface (second surface).

The resin layer removing solution supplied from the second surface passes through the through-hole(s) and reaches the resin layer on the first surface to dissolve and to remove the resin layer on the through-hole(s) and on the periphery of the through-hole(s). The mask layer is composed of a component insoluble in the resin layer removing solution. Accordingly, the resin layer removing solution can accurately remove only the resin layer on the through-hole(s) and on the periphery of the through-hole(s) precisely and selectively. Therefore, the resin layer can be extremely accurately formed with the substrate uncovered only on the through-hole(s) and on the periphery of the through-hole(s), and a landless or small-land-width pattern can be easily formed by the subsequent step.

In the method for forming a resist pattern according to the present invention, the resin layer and the mask layer are integrally formed, so that the steps can be simplified. An extremely stable method for forming a resist pattern can be simply realized by previously forming a film having the resin layer and the mask layer stacked, and forming the film integrally with the substrate by a means such as lamination.

In the method for forming a resist pattern according to the present invention, the resin layer is a photocrosslinkable resin layer. Accordingly, not only is the resin layer on the through-hole(s) and on the periphery of the through-hole(s) removed, but also a resist pattern can be formed on the surface of the substrate by pattern exposure, and the subsequent step of forming a circuit pattern on the through-hole(s) and the surface of the substrate can be simply performed.

In the method for forming a resist pattern according to the present invention, the substrate having a through-hole(s) is an insulating substrate having a conductive layer on the surface and on the inner wall of a through-hole(s). Therefore, it is possible to form a resist pattern for forming a more reliable circuit board.

Method for Producing Circuit Board by Semi-Additive Method

In the method for producing a circuit board according to the second aspect of the present invention, a photocrosslinkable resin layer and a mask layer are formed on a first surface of an insulating substrate having a first conductive layer on the surface and on the inner wall of a through-hole(s). Thereafter, the photocrosslinkable resin layer on the through-hole(s) and on a periphery of the through-hole(s) is removed by a photocrosslinkable resin layer removing solution supplied from a second surface. Accordingly, the first conductive layer on the through-hole(s) and on the periphery of the through-hole(s) can be accurately uncovered without requiring alignment. By controlling the removing method using the photocrosslinkable resin layer removing solution, it is possible to control the state of removing the photocrosslinkable resin layer on the through-hole(s) and on the periphery of the through-hole(s) and control the width of the uncovered periphery of the through-hole(s). Thereafter, the photocrosslinkable resin in a non-circuit part is cured by subjecting the photocrosslinkable resin layer on the first surface to pattern exposure. Then, after the steps of forming a photocrosslinkable resin layer and a mask layer on the second surface and removing the mask layer on the first surface, a photocrosslinkable resin layer removing solution is supplied from the first surface to remove an uncured photocrosslinkable resin layer on the first surface and the photocrosslinkable resin layer on the through-hole(s) and on the periphery of the through-hole(s) on the second surface. Here, since the cured photocrosslinkable resin is insoluble in the photocrosslinkable resin layer removing solution, a resist pattern by the cured photocrosslinkable resin is formed on the first surface. The first conductive layer on the through-hole(s) and on the periphery of the through-hole(s) on the second surface is accurately uncovered in the same manner. Thereafter, through the steps of subjecting the photocrosslinkable resin layer on the second surface to pattern exposure, removing the mask layer on the second surface, and supplying a photocrosslinkable resin layer removing solution to remove an uncured photocrosslinkable resin layer on the second surface, a resist pattern formed by the cured photocrosslinkable resin which functions as a plating resist layer can be formed on each of the first surface and the second surface. Subsequently, through the steps of forming a second conductive layer on the uncovered first conductive layer by electrolytic plating, removing the cured photocrosslinkable resin layers on the first surface and the second surface, and removing the uncovered first conductive layer by flash etching, a landless or small-land-width circuit board is produced.

The first conductive layer on the through-hole(s) and on the periphery of the through-hole(s) is uncovered on any of the first surface and the second surface, prior to the step of subjecting the photocrosslinkable resin layer to pattern exposure. Therefore, a favorable land shape can be ensured regardless of whether or not the periphery of the through-hole(s) is exposed in the pattern exposure step. That is, a landless or small-land-width can be accurately and surely formed without alignment, and the tolerance for alignment during pattern exposure is increased, highly advantageously.

In the method for forming a resist pattern and the method for producing a circuit board according to the present invention, the land width can be freely adjusted by controlling the amount of removing a photocrosslinkable resin layer in the step of removing the photocrosslinkable resin layer having a mask layer. According to these methods, a land on the periphery of a through-hole(s) has a uniform width as shown in FIG. 46.

As described above, in the method for forming a resist pattern and the method for producing a circuit board according to the present invention, a state where a plating resist layer is not present can be precisely and selectively formed on a through-hole(s) and on the periphery of the through-hole(s) and the land width can be freely controlled only by the steps without requiring alignment, highly advantageously.

Effect of Circuit Board According to Present Invention

The circuit board according to the third aspect of the present invention is a circuit board comprising a land conductive layer formed on a periphery of a through-hole(s) of an insulating substrate having the through-hole(s), a circuit conductive layer constituting a circuit wiring on a surface of the insulating substrate, and a conductive layer on an inner wall of the through-hole(s), which is produced by the methods for producing a circuit board according to the third aspect of the present invention, wherein the outer side surface of the land conductive layer in a part not connected to the circuit conductive layer has an inclination angle smaller than 90 degrees. The circuit boards according to the present invention are the circuit board according to the third aspect of the invention, wherein the outer side surface of the land conductive layer in the part not connected to the circuit conductive layer has an inclination angle of 60 to 80 degrees; the circuit board according to the third aspect of the invention, wherein a difference between the diameter formed by the outer side surface of the land conductive layer and a diameter of the through-hole(s) when the hole(s) is formed is 0 to 80 μm; the circuit board according to the third aspect of the invention, wherein the inclination angle of the outer side surface of the land conductive layer in the part not connected to the circuit conductive layer is smaller than the inclination angle of the side surface of the circuit conductive layer; the circuit board according to the third aspect of the invention, wherein a side surface of the circuit conductive layer has the inclination angle of about 90 degrees; and the circuit board according to the third aspect of the invention, wherein the land conductive layer is formed concentrically with the through-hole(s), respectively. Therefore, a landless or small-land-width circuit board can be realized, and, in particular, a solder resist can be extremely favorably provided thereafter, advantageously.

Specifically, in the circuit board, the substrate surface is covered with a solder resist and the through-hole(s) is filled with the solder resist to prevent soldering of the land, the circuit part and the like other than a pad necessary for soldering and to maintain insulation properties of the circuit surface and protect the conductor pattern. Here, since the top of the land conductive layer has a shape with an obtuse angle larger than 90 degrees, a favorable solder resist is provided without occurrence of a problem of an extremely thin top of the solder resist due to surface tension and curing shrinkage of the solder resist. It is typically assumed that the cross-sectional shape of a circuit conductive layer is preferably rectangular for obtaining a favorable signal transmission speed. In a conventional method for producing a circuit board, it is difficult to make the top of a land conductive layer have a shape with an obtuse angle while making the shape of a circuit conductive layer rectangular. However, in the circuit board according to the present invention, the top of the land conductive layer can have a shape with an obtuse angle, that is, the outer side surface of the land conductive layer can have an inclination angle smaller than 90 degrees with the circuit conductive layer having a rectangular cross-sectional shape, that is, with the side surface of the circuit conductive layer having the inclination angle of about 90 degrees. Therefore, not only the circuit board is a landless or small-land-width circuit board, but also it is possible to avoid a problem of an extremely thin solder resist in the land due to surface tension and curing shrinkage of the solder resist, advantageously.

Effect of Method for Producing Circuit Board by Subtractive Method According to Present Invention—1

In the method for producing a circuit board according to the fourth aspect of the present invention, there is prepared an insulating substrate having a through-hole(s), which has a conductive layer on a first surface, on a second surface opposite to the first surface and on an inner wall of the through-hole(s). Subsequently, a first resin layer and a mask layer are formed on the first surface to cover the conductive layer and an opening of the through-hole(s) on the first surface with the first resin layer and the mask layer. Then, a first resin layer removing solution is supplied from the second surface to remove the first resin layer on the through-hole(s) and on a periphery of the through-hole(s) on the first surface and to uncover the conductive layer on the periphery of the through-hole(s) on the first surface.

Accordingly, the conductive layer on the through-hole(s) and on the periphery of the through-hole(s) can be accurately uncovered without requiring alignment. By controlling the removing conditions using the first resin layer removing solution, it is possible to control the state of removing the first resin layer on the through-hole(s) and on the periphery of the through-hole(s) and control the width of the uncovered conductive layer on the periphery of the through-hole(s) to a desired value.

Thereafter, a treatment for provision of resistance against a second resin layer removing solution is provided to the first resin layer on the first surface. Accordingly, the first resin layer on the first surface is not affected by a second resin layer removing solution for later treatment, and a favorable opening state already formed can be maintained. Thereafter, the mask layer on the first surface is removed, and a second resin layer and a mask layer are formed on the second surface to cover the conductive layer and an opening of the through-hole(s) on the second surface with the second resin layer and the mask layer.

Subsequently, a second resin layer removing solution is supplied from the first surface to remove the second resin layer on the through-hole(s) and on the periphery of the through-hole(s) on the second surface and to uncover the conductive layer on the periphery of the through-hole(s) on the second surface. Accordingly, the conductive layer on the through-hole(s) and on the periphery of the through-hole(s) on the second surface can also be accurately uncovered without requiring alignment, so that the favorable opening state in the first resin layer already formed on the first surface is not affected. By controlling the removing conditions using the second resin layer removing solution, it is possible to control the state of removing the second resin layer on the through-hole(s) and on the periphery of the through-hole(s) and control the width of the uncovered conductive layer on the periphery of the through-hole(s) to a desired value.

Thereafter, the mask layer on the second surface is removed to prepare a substrate having an opening provided by removing the resin layers in the through-hole(s) and on the periphery of the through-hole(s) on the first surface and the second surface (hereinafter called "resin-adhered opening substrate"). A circuit board having a through-hole(s) with a land having any uniform width can be produced by performing a series of steps including this step, in which a plugging ink step, a conductive ink filling step, an electrodeposition step, a metal plating step, a resist forming step, an etching step and the like are appropriately combined.

In the method for producing a circuit board according to the present invention, the resin-adhered opening substrate is prepared by the method according to the fourth aspect of the invention, and an etching resist layer is formed on the uncovered conductive layer on the substrate. Accordingly, the etching resist layer can be stably formed on the inner wall of the through-hole(s) and on the periphery of the through-hole(s). The etching resist layer is formed on the inner wall of the through-hole(s) and on the periphery of the through-hole(s) separately from a surface wiring pattern, so that the necessary and sufficient etching resist layer can be formed in the through-hole(s) and on the periphery of the through-hole(s) and conduction reliability and structural strength of the through-hole(s) are ensured. Since the thickness and the like of the etching resist layer for forming a surface wiring pattern can be selected according to the quality needed for the circuit board, a surface wiring pattern can be favorably formed.

Thereafter, the first resin layer and the second resin layer are removed, and then a photocrosslinkable resin layer for forming a wiring pattern is formed on the first surface and the second surface. Subsequently, the photocrosslinkable resin layers on the first surface and the second surface is photocrosslinking cured in a pattern by pattern exposure. Then, uncured photocrosslinkable resin layers on the first surface and the second surface is removed to uncover the conductive layer in a pattern, and the uncovered conductive layer on the first surface and the second surface is removed by etching with an etchant, followed by removing the etching resist layer in the through-hole(s) and on the periphery of the through-hole(s) and the photocrosslinking cured photocrosslinkable resin layers on the first surface and the second surface. By these steps, a circuit board having a through-hole(s) with a land having any uniform width can be favorably produced by the subtractive method. The conductive layer can be set to have a desired thickness at the stage of preparation of the substrate, a sufficient copper circuit thickness can be ensured, and a circuit board having a reliable wiring pattern can be prepared.

The etching resist layer is formed on the conductive layer on the through-hole(s) and on the periphery of the through-hole(s) on any of the first surface and the second surface, prior to the step of subjecting the photocrosslinkable resin layer to pattern exposure. Therefore, a favorable land shape can be ensured regardless of whether or not the periphery of the through-hole(s) is exposed in the pattern exposure step. That is, a landless or small-land-width state can be accurately and surely formed without alignment, and the tolerance for alignment during pattern exposure is increased, highly advantageously.

In the method for producing a circuit board according to the present invention, the first resin layer and the second resin layer are photocrosslinkable resins and the treatment for provision of resistance is an exposure treatment, so that the circuit board can be produced using existing equipment.

In the method for producing a circuit board according to the present invention, a metal layer insoluble in the etchant is formed in the wiring part by pattern plating, so that the metal layer functions as a favorable etching resist layer, and a favorable wiring pattern is formed by subsequent etching.

In the method for producing a circuit board according to the present invention, the mask layer on the first surface is removed before providing the first resin layer with a treatment for provision of resistance. Accordingly, a risk factor from the mask layer is eliminated, when it is necessary to perform additional treatment such as washing or drying in the through-hole(s) after the step of removing the first resin layer, or when the mask layer may adversely affect the treatment for provision of resistance.

In the method for producing a circuit board according to the present invention, the mask layer on the first surface is removed after forming the second resin layer and the mask layer on the second surface. Accordingly, the mask layer on the first surface also has a protective function, when scratches, adhesion of foreign matter, and the like due to contact may occur on the first surface in the formation of the second resin layer and the mask layer on the second surface.

As described above, in the methods for producing a circuit board according to the present invention, an etching resist layer can be precisely and stably formed on a through-hole(s) and on the periphery of the through-hole(s) and the land width can also be freely controlled even by a simple method such as the subtractive method using existing production equipment without requiring introduction of new equipment, highly advantageously. Further, an etching resist film which has conventionally been required to be thick for tenting can be thin and a fine pattern is also advantageously formed, advantageously.

Effect of Method for Producing Circuit Board by Subtractive Method According to Present Invention—2

In the method for producing a circuit board according to the fifth aspect of the present invention, a photocrosslinkable resin layer and a mask layer are formed on a first surface of an insulating substrate having a conductive layer on the surface and on the inner wall of a through-hole(s). Thereafter, the photocrosslinkable resin layer on the through-hole(s) and on a periphery of the through-hole(s) is removed by a photocrosslinkable resin layer removing solution supplied from a second surface. Accordingly, the first conductive layer on the through-hole(s) and on the periphery of the through-hole(s) can be accurately uncovered without requiring alignment. By changing the removing conditions using the photocrosslinkable resin layer removing solution, it is possible to control the amount of the removed photocrosslinkable resin layer on the through-hole(s) and on the periphery of the through-hole(s) and control the width of the uncovered periphery of the through-hole(s). Thereafter, the photocrosslinkable resin layer in a non-circuit part is photocrosslinking cured by subjecting the photocrosslinkable resin layer on the first surface to pattern exposure. Then, after the steps of forming a photocrosslinkable resin layer and a mask layer on the second surface and removing the mask layer on the first surface, a photocrosslinkable resin layer removing solution is supplied from the first surface to remove an uncured photocrosslinkable resin layer on the first surface and the photocrosslinkable resin layer on the through-hole(s) and on the periphery of the through-hole(s) on the second surface. Here, since the photocrosslinking cured photocrosslinkable resin layer is insoluble or poorly soluble in the photocrosslinkable resin layer removing solution, the photocrosslinking cured photocrosslinkable resin layer is formed in a pattern on the first surface. The conductive layer on the through-hole(s) and on the periphery of the through-hole(s) on the second surface is accurately uncovered in the same manner. Thereafter, through the steps of subjecting the photocrosslinkable resin layer on the second surface to pattern exposure, removing the mask layer on the second surface, and supplying a photocrosslinkable resin layer removing solution to remove the uncured photocrosslinkable resin layer on the second surface, the photocrosslinking cured photocrosslinkable resin layer can be formed in a pattern on each of the first surface and the second surface. Subsequently, through the steps of forming an etching resist layer on the uncovered conductive layer, removing the photocrosslinking cured photocrosslinkable resin layers on the first surface and the second surface, removing the uncovered conductive layer by etching, and removing the etching resist layer, a landless or small-land-width circuit board is produced.

The conductive layer on the periphery of the through-hole(s) is uncovered on any of the first surface and the second surface, prior to the step of subjecting the photocrosslinkable resin layer on each surface to pattern exposure, and is surely protected by the etching resist layer in the subsequent step. Therefore, a favorable land shape can be ensured regardless of whether or not the periphery of the through-hole(s) is exposed in the pattern exposure step. That is, a landless or small-land-width can be accurately and surely formed without alignment, and the tolerance for alignment during pattern exposure is increased, highly advantageously.

In the method for producing a circuit board according to the fifth aspect of the present invention, the land width can be freely adjusted by controlling the amount of the removed photocrosslinkable resin layer in the step of removing the photocrosslinkable resin layer having the mask layer. According to this method, a land on the periphery of the through-hole(s) has a uniform width as shown in FIG. 46.

Therefore, in the method for producing a circuit board according to the fifth aspect of the present invention, a circuit board having a through-hole(s) with a land having any uniform width can be favorably produced by the subtractive method. The conductive layer can be set to have a desired thickness at the stage of preparation of the substrate, a sufficient thickness of the conductive layer can be ensured, and a circuit board having a reliable wiring pattern can be prepared.

In the method for producing a circuit board according to the present invention, the mask layer on the first surface is removed before forming the photocrosslinkable resin layer and the mask layer on the second surface. Accordingly, the mask layer on the first surface can be removed before forming the photocrosslinkable resin layer and the mask layer on the second surface, when scratches, adhesion of foreign matter, and the like due to contact do not occur on the first surface in the formation of the photocrosslinkable resin layer and the mask layer on the second surface.

In the method for producing a circuit board according to the present invention, the mask layer on the first surface is removed before subjecting the photocrosslinkable resin layer on the first surface to pattern exposure. A risk factor such as a decreased resolution caused by the mask layer is eliminated by removing the mask layer prior to the pattern exposure, when it is necessary to perform additional treatment such as washing or drying in the through-hole(s) after the step of removing the photocrosslinkable resin layer on the through-hole(s) and on the periphery of the through-hole(s) on the first surface, or when the mask layer may adversely affect the pattern exposure.

In the method for producing a circuit board according to the present invention, the photocrosslinkable resin layer on the through-hole(s) and on the periphery of the through-hole(s) on the second surface is removed after subjecting the photocrosslinkable resin layer on the first surface to pattern exposure and then removing the uncured photocrosslinkable resin layer on the first surface. Accordingly, when there is no removing conditions satisfactory as both the conditions for removing the uncured photocrosslinkable resin layer on the first surface and the conditions for removing the photocrosslinkable resin layer on the through-hole(s) and on the periphery of the through-hole(s) on the second surface, treatment can be favorably performed in separate steps by selecting conditions optimal as the respective removing conditions.

As described above, in the methods for producing a circuit board according to the fifth aspect of the present invention, an etching resist layer can be precisely and stably formed on a through-hole(s) and on the periphery of the through-hole(s) and in a wiring pattern on the surface and the land width can also be freely controlled by the subtractive method, using existing production equipment without requiring introduction of new equipment, highly advantageously. It is possible to achieve an advantage which has conventionally been impossible to be achieved without introduction of new equipment such as a developing apparatus for toner electrodeposition, and it is possible to avoid a risk of occurrence of defects by abnormal toner electrodeposition or the like. Further, an etching resist film which has conventionally been required to be thick for tenting can be thin and a fine pattern is also advantageously formed, advantageously.

DETAILED DESCRIPTION OF THE INVENTION

The method for forming a resist pattern, the method for producing a circuit board, and the circuit board according to the present invention will be described in detail below.

Method for Forming Resist Pattern

Figure 4:
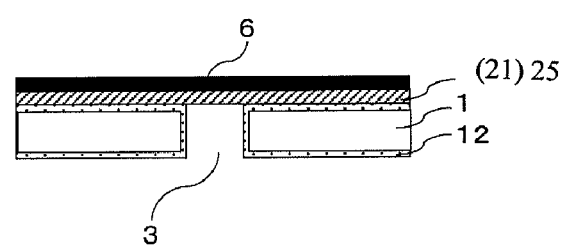
FIG. 4 is a cross-sectional view showing a step subsequent to FIG. 3 in the method according to the present invention.
Figure 5:
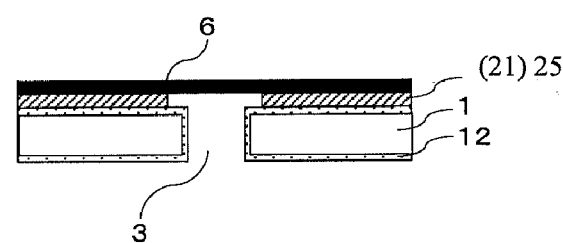
FIG. 5 is a cross-sectional view showing a step subsequent to FIG. 4 in the method according to the present invention.

In the method for forming a resist pattern according to the present invention, a first resin layer 21 and a first surface mask layer 6 are provided on one surface (first surface) of a substrate having a through-hole 3 to plug the through-hole 3 as shown in FIG. 4, and the resin layer on the through-hole 3 and on a periphery of the through-hole 3 on the first surface is removed by a resin layer removing solution supplied from a surface opposite to the first surface (second surface) (FIG. 5).

Method for Producing Circuit Board by Semi-Additive Method

In the method for producing a circuit board according to the second aspect of the present invention, resist patterns are sequentially formed on both surfaces as follows, and a circuit board is produced by the semi-additive method. As a method for forming a resist pattern, any of the methods according to the first aspect of the present invention is used.

Figure 1:
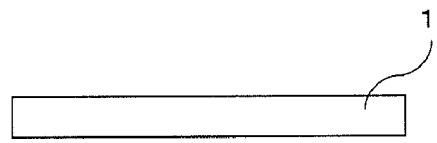
FIG. 1 is a cross-sectional view showing a step in the method according to the present invention.
Figure 2:
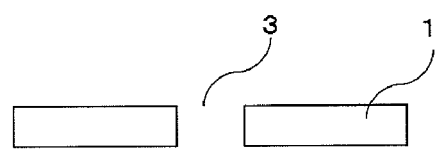
FIG. 2 is a cross-sectional view showing a step subsequent to FIG. 1 in the method according to the present invention.
Figure 3:
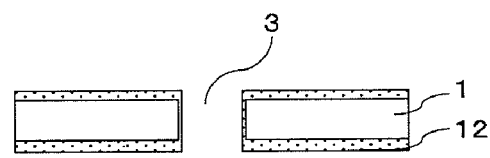
FIG. 3 is a cross-sectional view showing a step subsequent to FIG. 2 in the method according to the present invention.
Figure 6:
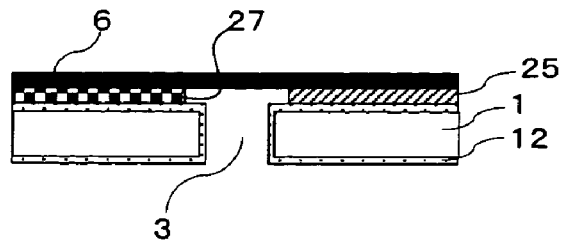
FIG. 6 is a cross-sectional view showing a step subsequent to FIG. 5 in the method according to the present invention.

First, a through-hole 3 (FIG. 2) is formed on an insulating substrate 1 (FIG. 1). Then, a first conductive layer 12 is provided on the surface of the insulating substrate 1 and on the inner wall of the through-hole 3 (FIG. 3). Thereafter, a first surface photocrosslinkable resin layer 25 is formed on a first surface to tent the through-hole 3 (FIG. 4). Here, a mask layer 6 is formed on and in contact with the photocrosslinkable resin layer 25. Then, a photocrosslinkable resin layer removing solution is supplied from a second surface opposite to the first surface to dissolve and to remove the photocrosslinkable resin layer 25 on the through-hole 3 and on a periphery of the through-hole 3 on the first surface (FIG. 5). The amount of the removed photocrosslinkable resin layer 25 on the through-hole 3 and on the periphery of the through-hole 3 can be adjusted and the width of the uncovered first conductive layer 12 can be controlled by adjusting the removing conditions such as the type and concentration of the removing solution, the removing time and temperature, and the spray pressure and discharge amount of the removing solution when a spray is used. Accordingly, the land width can be controlled to form a landless, a narrow land or a broad land thereafter. Washing and drying are performed where necessary, and then the first surface photocrosslinkable resin layer 25 is subjected to pattern exposure. The photocrosslinkable resin in a non-circuit part is cured by the pattern exposure (FIG. 6).

Figure 7:
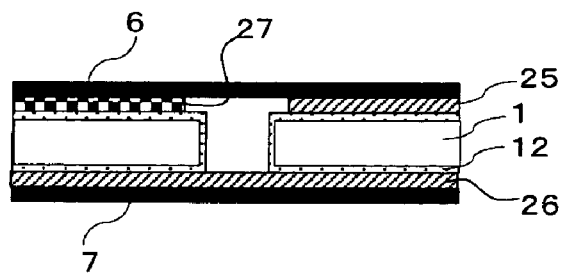
FIG. 7 is a cross-sectional view showing a step subsequent to FIG. 6 in the method according to the present invention.
Figure 8:
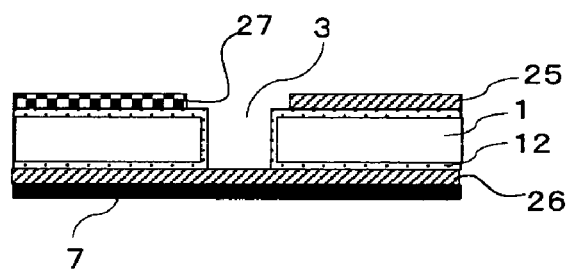
FIG. 8 is a cross-sectional view showing a step subsequent to FIG. 7 in the method according to the present invention.
Figure 9:
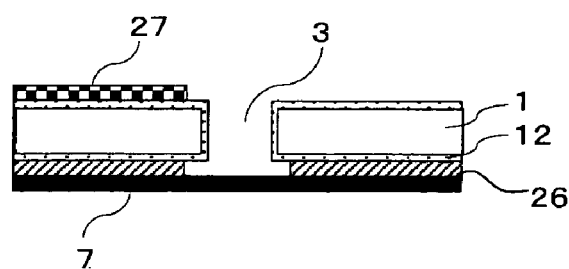
FIG. 9 is a cross-sectional view showing a step subsequent to FIG. 8 in the method according to the present invention.
Figure 10:
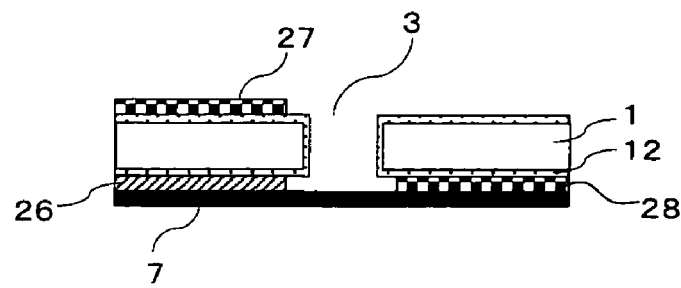
FIG. 10 is a cross-sectional view showing a step subsequent to FIG. 9 in the method according to the present invention.

A second surface photocrosslinkable resin layer 26 and a second surface mask layer 7 are also formed on the second surface by the same method as used for the first surface (FIG. 7). After removing the first surface mask layer 6 (FIG. 8), treatment using a photocrosslinkable resin layer removing solution is performed again. The removing solution is supplied at least from the first surface to dissolve and to remove the uncured photocrosslinkable resin layer 25 on the first surface, and to dissolve and to remove the photocrosslinkable resin layer 26 on the through-hole 3 and on the periphery of the through-hole 3 on the second surface through the through-hole 3 (FIG. 9). Here, the amount of the removed photocrosslinkable resin layer 26 on the through-hole 3 and on the periphery of the through-hole 3 on the second surface can be adjusted and the width of the uncovered first conductive layer 12 can be controlled in the same manner as in the treatment of the first surface. Washing and drying are performed where necessary, and then the second surface photocrosslinkable resin layer 26 is subjected to pattern exposure to cure the photocrosslinkable resin in a non-circuit part (FIG. 10).

The first surface mask layer 6 may be removed before forming the second surface photocrosslinkable resin layer 26 and the mask layer 7, if the removal is performed after the step of removing the photocrosslinkable resin layer 25 on the through-hole 3 and on the periphery of the through-hole 3 on the first surface. When the first surface may be damaged or contaminated in the formation of the second surface photocrosslinkable resin layer 26 and the mask layer 7, it is preferable to remove the first surface mask layer 6 after forming the second surface photocrosslinkable resin layer 26 and the mask layer 7, because the first surface after pattern exposure can be protected by the mask layer 6. On the other hand, it is also possible to remove the mask layer 6 and then perform drying, exposure or the like, after the step of removing the photocrosslinkable resin layer 25 on the through-hole 3 and on the periphery of the through-hole 3 on the first surface. Further, it is possible to form the photocrosslinkable resin layer 26 and the mask layer on the second surface and then remove the photocrosslinkable resin layer on the through-hole 3 and on the periphery of the through-hole 3 on the second surface, after removing the uncured photocrosslinkable resin layer on the first surface.

Figure 11:
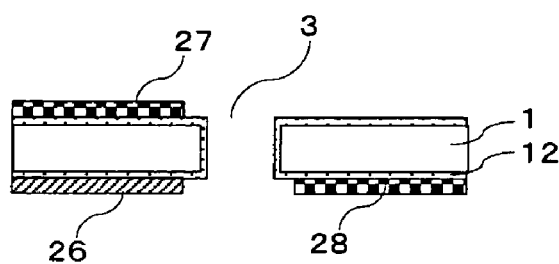
FIG. 11 is a cross-sectional view showing a step subsequent to FIG. 10 in the method according to the present invention.
Figure 12:
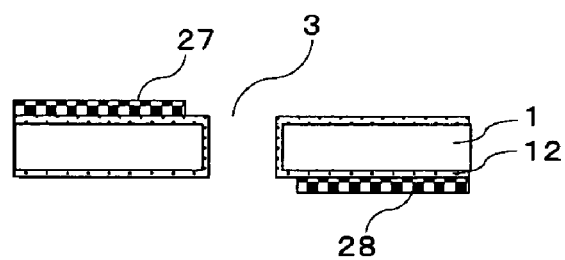
FIG. 12 is a cross-sectional view showing a step subsequent to FIG. 11 in the method according to the present invention.

After removing the pattern exposed second surface mask layer 7 (FIG. 11), treatment using a photocrosslinkable resin layer removing solution is performed. The removing solution is supplied at least from the second surface to dissolve and to remove an uncured photocrosslinkable resin layer 26 on the second surface (FIG. 12).

Figure 13:
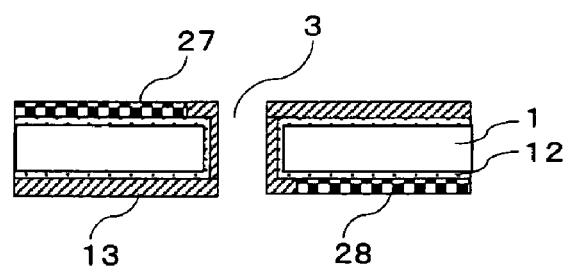
FIG. 13 is a cross-sectional view showing a step subsequent to FIG. 12 in the method according to the present invention.
Figure 14:
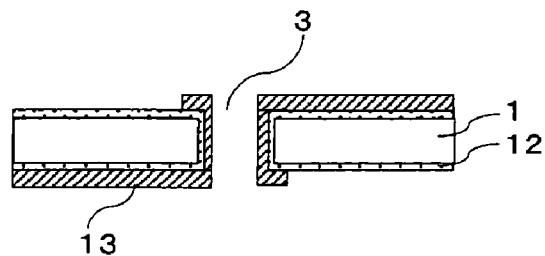
FIG. 14 is a cross-sectional view showing a step subsequent to FIG. 13 in the method according to the present invention.
Figure 15:
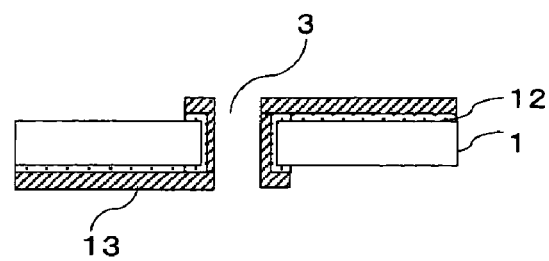
FIG. 15 is a cross-sectional view showing a step subsequent to FIG. 14 in the method according to the present invention.

Accordingly, resist patterns formed by cured photocrosslinkable resins 27 and 28 functioning as plating resist layers can be formed on both the first surface and the second surface. Then, a second conductive layer 13 is formed on the uncovered first conductive layer 12 by electrolytic plating (FIG. 13). Thereafter, the photocrosslinking cured photocrosslinkable resin layers 27 and 28 on the first surface and the second surface are removed (FIG. 14). The uncovered first conductive layer 12 is flash etched, so that a landless or small-land-width circuit board can be produced (FIG. 15).

Circuit Board

Figure 40:
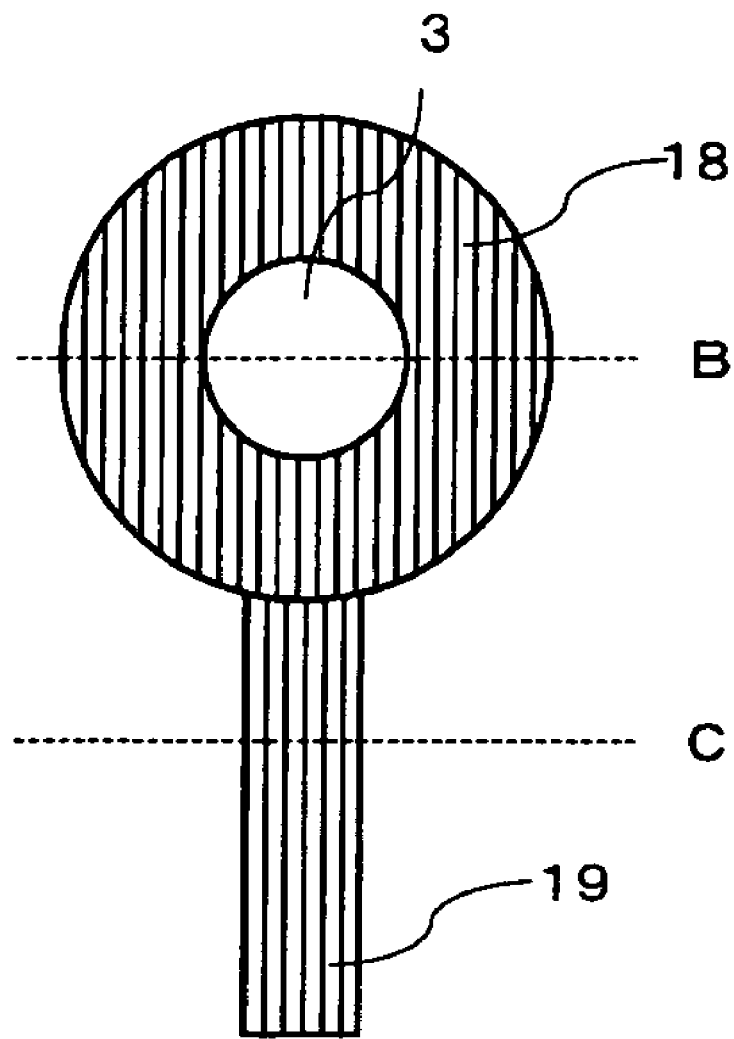
FIG. 40 is a plan view showing a hole land in the circuit board according to the present invention.

FIG. 40 is a schematic plan view showing a land and a circuit part of the circuit board according to the present invention. The circuit board according to the present invention is produced by the methods for producing a circuit board according to the second aspect of the present invention. The land conductive layer according to the present invention is a conductive layer forming a land and is a region indicated by the symbol "18" in FIG. 40. The circuit conductive layer according to the present invention is a conductive layer forming a wiring that forms a circuit on the surface other than the surface of a through-hole 3 and the land, and is a region indicated by the symbol "19" in FIG. 40.

The part of the land not connected to the circuit conductive layer 19 according to the present invention is a region in the land conductive layer 18 not in contact with the circuit conductive layer 19.

The inclination angle of the outer side surface of the land conductive layer 18 and the inclination angle of the side surface of the circuit conductive layer 19 according to the present invention will be described below with reference to FIGS. 40 to 42.

FIG. 41(a) is a schematic cross-sectional view of FIG. 40 along the line B. FIG. 42(a) is a schematic cross-sectional view of FIG. 40 along the line C. FIG. 41(a) shows a cross-section of the land conductive layer 18 in the part of the land not connected to the circuit conductive layer. The inclination angle X of the outer side surface of the land conductive layer 18 means an angle formed by a line connecting a land conductive layer top 18a to a land conductive layer bottom 18b and the surface of an insulating substrate 1, the angle on the side of nipping the conductive layer. Here, as shown in FIG. 41(a), the land conductive layer bottom 18b is an outer peripheral contour of the surface of the land conductive layer 18 in contact with the insulating substrate 1.

FIG. 42(a) shows a cross-section of the circuit conductive layer 19. The inclination angle Y of the side surface of the circuit conductive layer 19 means an angle formed by a line connecting a circuit conductive layer top 19a to a circuit conductive layer bottom 19b and the surface of the insulating substrate 1, the angle on the side of nipping the conductive layer. Here, as shown in FIG. 42(a), the circuit conductive layer bottom 19b is a contour of the surface of the circuit conductive layer 19 in contact with the insulating substrate 1.

Figure 41:
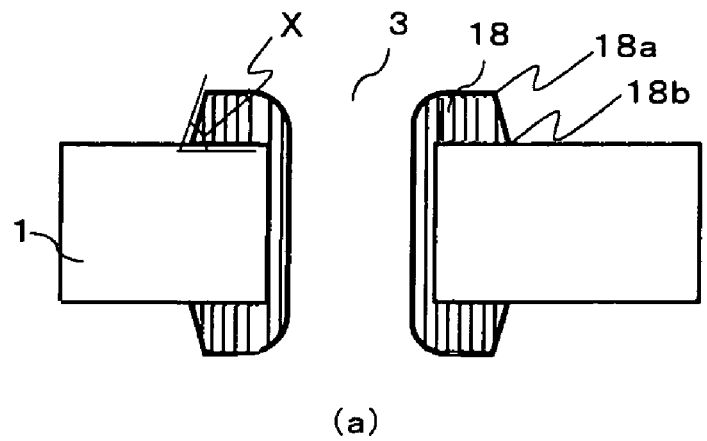
FIG. 41 is a cross-sectional view of FIG. 40 along the line B.
Figure 41:
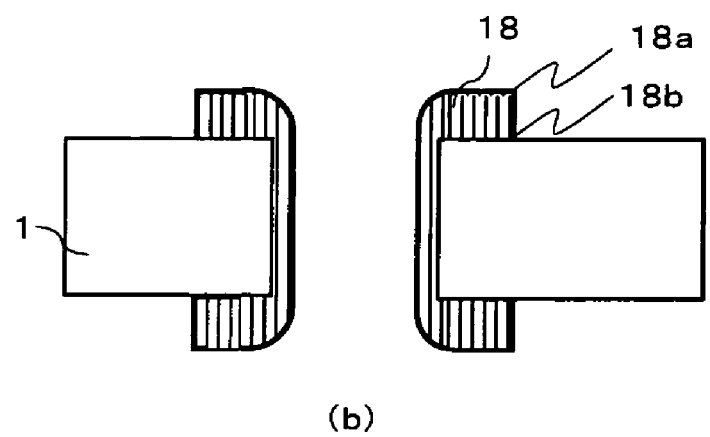
Figure 41:
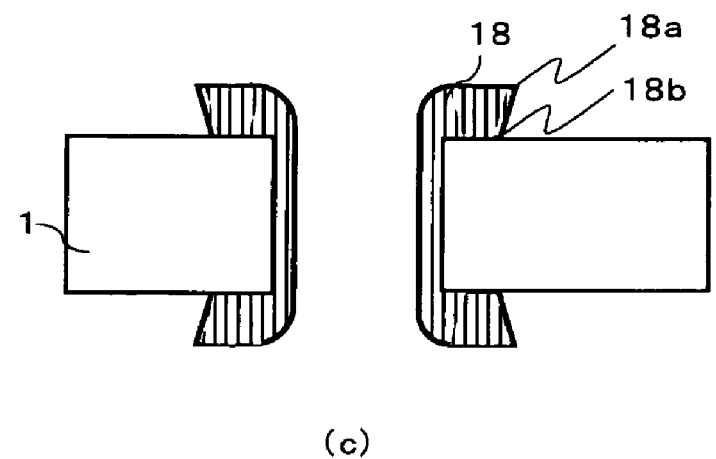
Figure 42:
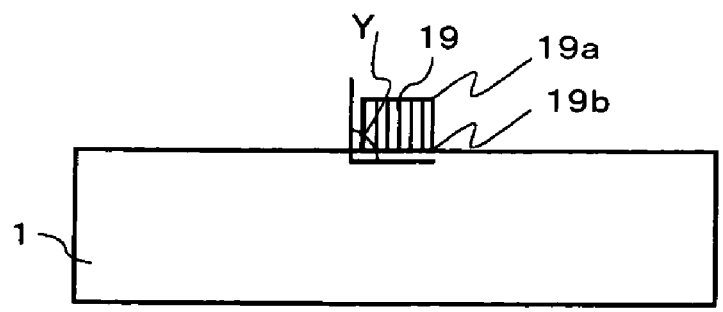
FIG. 42 is a cross-sectional view of FIG. 40 along the line C.
Figure 42:
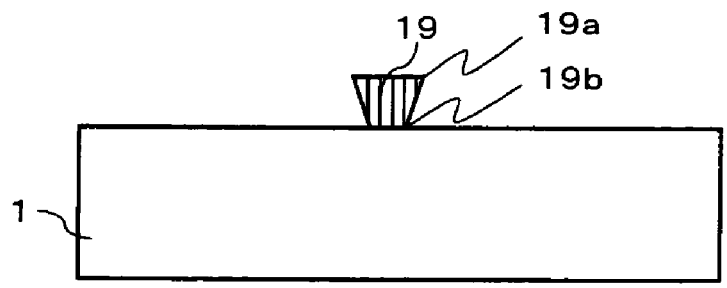
Figure 42:
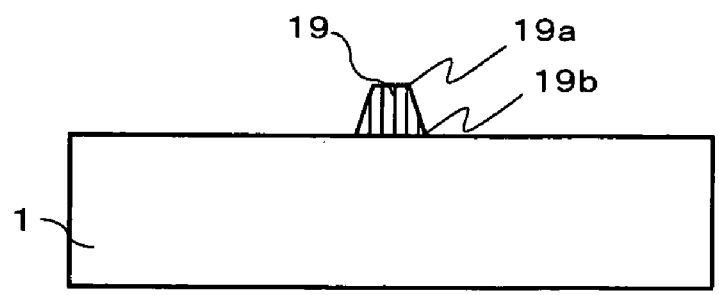
Figure 43:
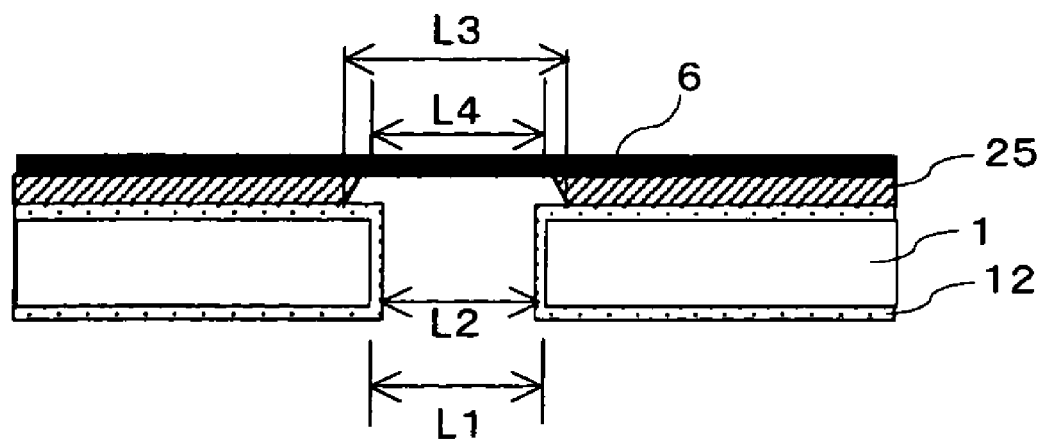
FIG. 43 is a cross-sectional view showing a diameter of a through-hole when the hole is formed, a diameter of a through-hole when plated, and a diameter of a part from which a photocrosslinkable resin layer is removed in the method according to the present invention.
Figure 44:
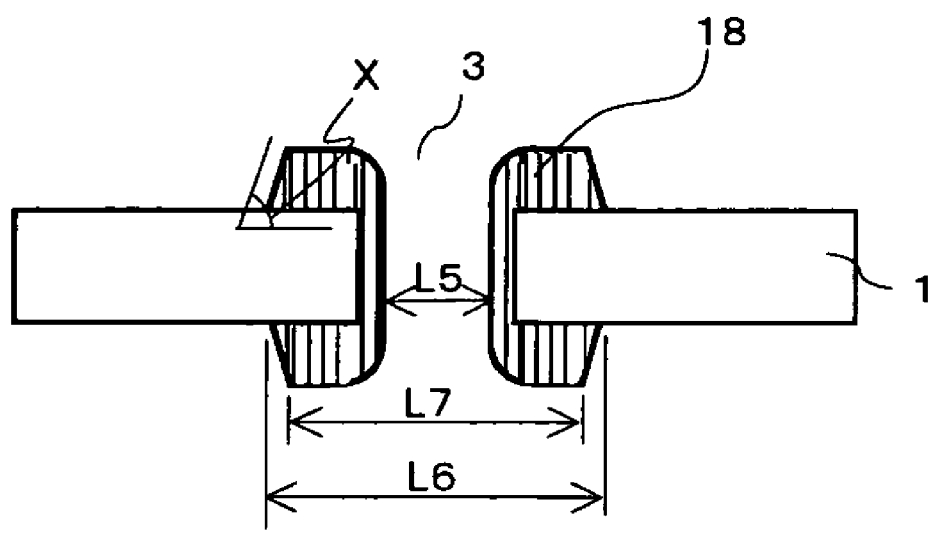
FIG. 44 is a cross-sectional view showing a hole land in the circuit board according to the present invention.
Figure 45:
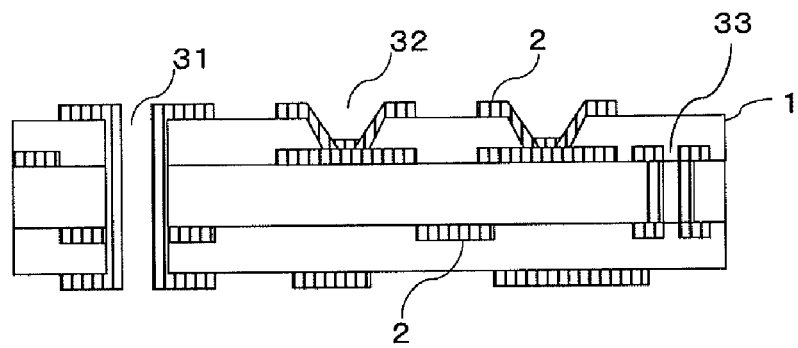
FIG. 45 is a schematic cross-sectional view showing an example of a multilayer circuit board.
Figure 45:
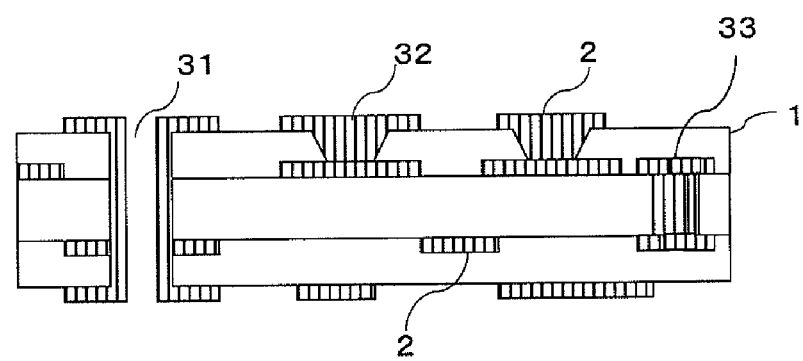
Figure 46:
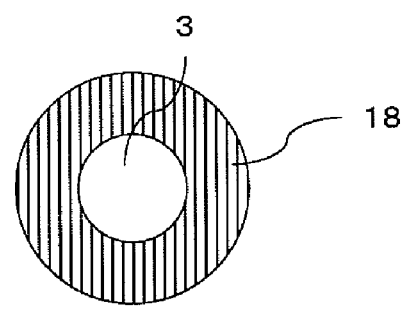
FIG. 46 is a schematic plan view showing a through-hole and a land.
Figure 47:
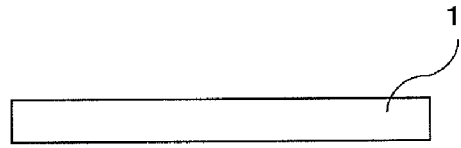
FIG. 47 is a cross-sectional view showing a step in the method for producing a circuit board by a semi-additive method.
Figure 48:
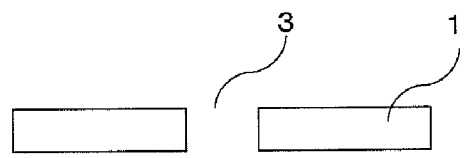
FIG. 48 is a cross-sectional view showing a step subsequent to FIG. 47 in the method for producing a circuit board by a semi-additive method.
Figure 49:
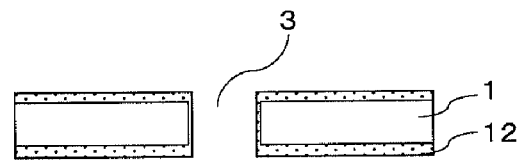
FIG. 49 is a cross-sectional view showing a step subsequent to FIG. 48 in the method for producing a circuit board by a semi-additive method.
Figure 50:
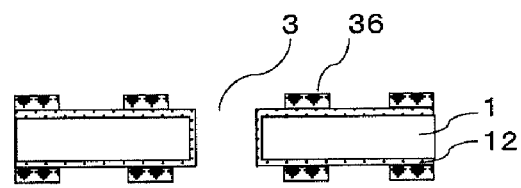
FIG. 50 is a cross-sectional view showing a step subsequent to FIG. 49 in the method for producing a circuit board by a semi-additive method.
Figure 51:
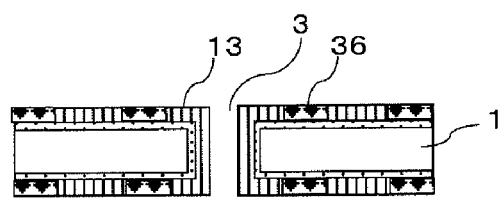
FIG. 51 is a cross-sectional view showing a step subsequent to FIG. 50 in the method for producing a circuit board by a semi-additive method.
Figure 52:
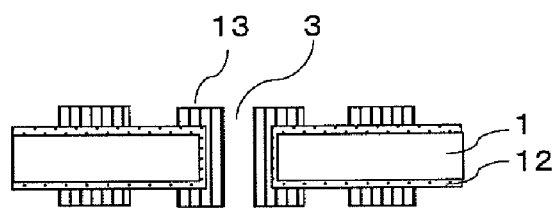
FIG. 52 is a cross-sectional view showing a step subsequent to FIG. 51 in the method for producing a circuit board by a semi-additive method.
Figure 53:
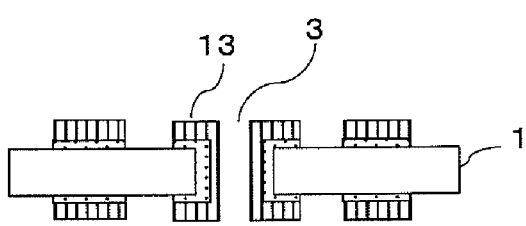
FIG. 53 is a cross-sectional view showing a step subsequent to FIG. 52 in the method for producing a circuit board by a semi-additive method.
Figure 54:
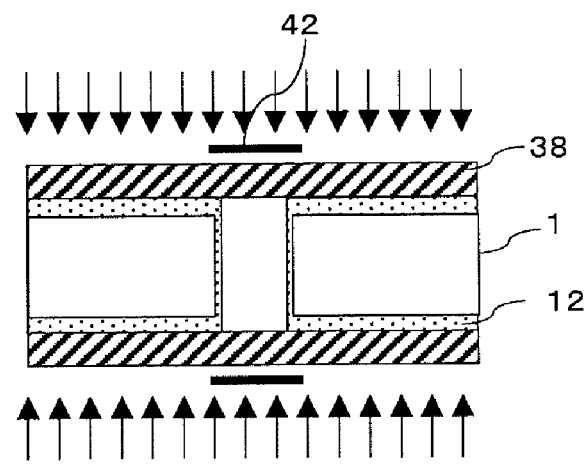
FIG. 54 is a cross-sectional view showing an exposure step in a method for producing a circuit board using a photocrosslinkable dry film photoresist according to the prior art.
Figure 55:
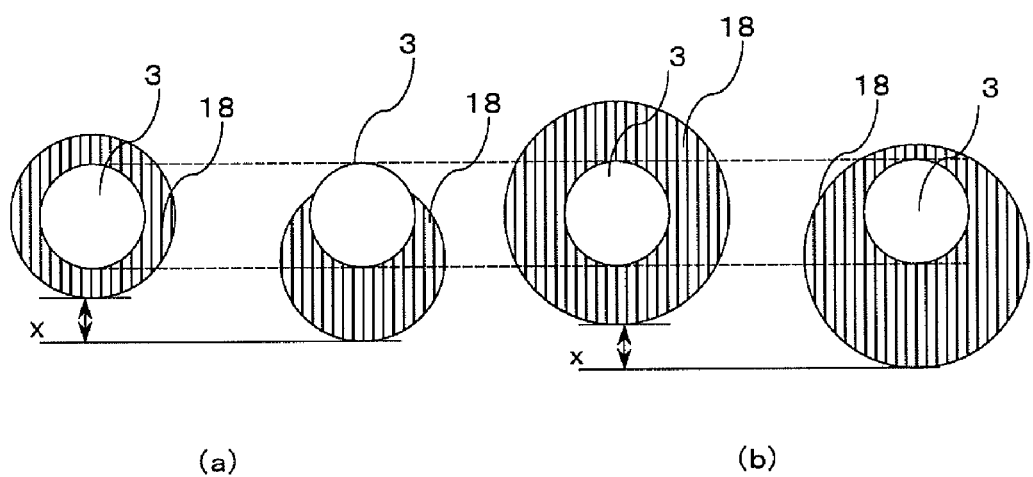
FIG. 55 is a schematic view showing misalignment between a through-hole and a land.
Figure 56:
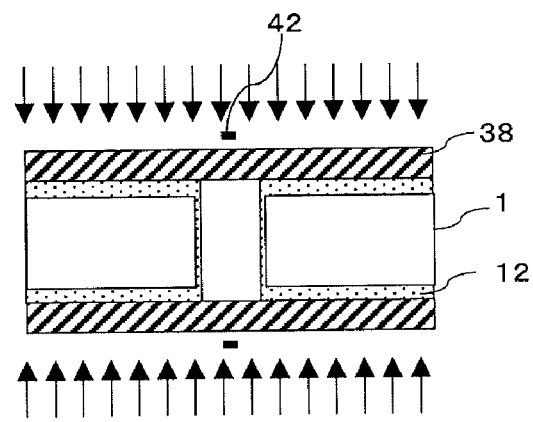
FIG. 56 is a cross-sectional view showing an exposure step in a method for producing a circuit board using a photocrosslinkable dry film photoresist according to the prior art.
Figure 57:
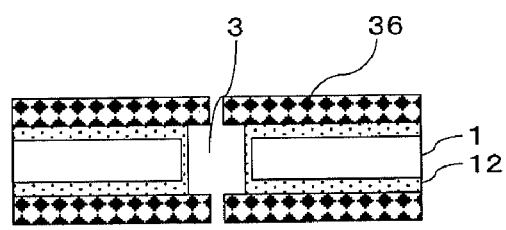
FIG. 57 is a cross-sectional view showing a step in a method for producing a circuit board using a photocrosslinkable dry film photoresist according to the prior art.
Figure 58:
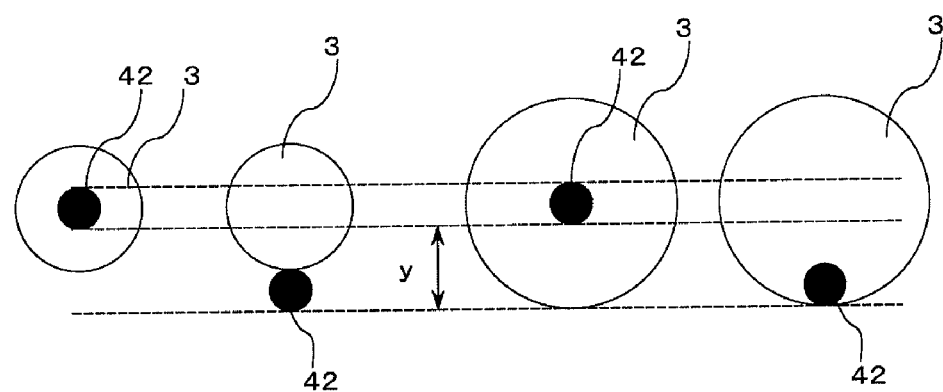
FIG. 58 is a schematic view showing misalignment between a through-hole and a photomask shielding part.

FIG. 41 also shows a cross-section of the land conductive layer 18 in the case where the outer side surface of the land conductive layer 18 has an inclination angle X of about 90 degrees (FIG. 41(b)) and the case where the outer side surface of the land conductive layer 18 has an inclination angle X larger than 90 degrees (FIG. 41(c)) for comparison, in addition to a cross-section in the case where the outer side surface of the land conductive layer 18 has an inclination angle X smaller than 90 degrees (FIG. 41(a)). FIG. 42 also shows a cross-section of the circuit conductive layer 19 in the case where the side surface of the circuit conductive layer 19 has an inclination angle Y larger than 90 degrees (FIG. 42(b)) and the case where the side surface of the circuit conductive layer 19 has an inclination angle Y smaller than 90 degrees (FIG. 42(c)) for comparison, in addition to a cross-section in the case where the side surface of the circuit conductive layer 19 has an inclination angle Y of about 90 degrees (FIG. 42(a)). Here, the term "about 90 degrees" means 85 to 95 degrees.

It is typically assumed that the cross-sectional shape of the circuit conductive layer 19 is preferably rectangular for obtaining a favorable signal transmission speed. However, in a conventional method for producing a circuit board, it is difficult to change the shape of the top of the land conductive layer 18 while making the shape of the circuit conductive layer 19 rectangular. Therefore, in the circuit board according to the present invention, the outer side surface of the land conductive layer 18, which is formed concentrically with the through-hole 3 and continuously with the periphery of the through-hole 3, in the part not connected to the circuit conductive layer 19 has an inclination angle X smaller than 90 degrees as shown in FIG. 41(a), with the circuit conductive layer 19 having a rectangular cross-sectional shape, specifically, with the side surface of the circuit conductive layer 19 having the inclination angle of about 90 degrees.

That is, the circuit board according to the present invention is a circuit board in which the inclination angle X of the outer side surface of the land conductive layer 18 differs from the inclination angle Y of the side surface of the circuit conductive layer 19, the side surface of the circuit conductive layer 19 has an inclination angle Y of about 90 degrees, and the outer side surface of the land conductive layer 18 has an inclination angle X smaller than 90 degrees. Since the land conductive layer 18 and the circuit conductive layer 19 of the circuit board have such cross-sectional shapes, a favorable signal transmission speed in the circuit conductive layer 19 can be maintained, while a favorable solder resist can be provided without occurrence of a problem of an extremely thin top of the solder resist due to surface tension and curing shrinkage of the solder resist, advantageously. The inclination angle X of the outer side surface of the land conductive layer 18 is preferably in the range of 30 degrees to 80 degrees, and more preferably in the range of 60 degrees to 80 degrees.

The inclination angle X of the outer side surface of the land conductive layer 18 varies according to the plating thickness by electrolytic plating, the thickness of the photocrosslinkable resin layer, and the conditions for removing the photocrosslinkable resin layer using a photocrosslinkable resin layer removing solution. For example, under the same conditions for removing the photocrosslinkable resin layer, the larger the plating thickness by electrolytic plating, the smaller the inclination angle X of the outer side surface of the land conductive layer 18. Under the same conditions for removing the photocrosslinkable resin layer, the larger the thickness of the photocrosslinkable resin layer, the smaller the inclination angle X of the outer side surface of 18. However, optimization of the conditions for removing the photocrosslinkable resin layer is also effective for reducing the inclination angle X of the outer side surface of the land conductive layer 18. When the land width is increased by increasing the amount removed by the photocrosslinkable resin layer removing solution, the inclination angle of the outer side surface of the land conductive layer 18 is increased and changed closer to 90 degrees. The inclination angle X of the outer side surface of the land conductive layer 18 is smaller under the conditions where the land width formed is smaller. As described above, the amount of the removed photocrosslinkable resin layer is controlled by adjusting the conditions such as the type and concentration of the removing solution, the removing time and temperature, and the spray pressure and discharge amount of the removing solution when a spray is used. A landless or small-land-width state is formed by the method for producing a circuit board according to the present invention, making it possible to obtain a circuit board with a favorable inclination angle of the outer side surface of the land conductive layer 18. In the method for producing a circuit board according to the present invention, the conditions for removing the resin layer or photocrosslinkable resin layer depend on the thickness of such a resin layer. For example, when the photocrosslinkable resin layer has a thickness of 20 to 30 μm, the removing solution used is a 1 mass % sodium carbonate solution, the removing temperature is 30° C., the treatment time is 20 to 60 seconds, and the spray pressure is 0.1 to 0.3 MPa under preferable removing conditions.

Method for Producing Circuit Board by Subtractive Method—1

Figure 16:
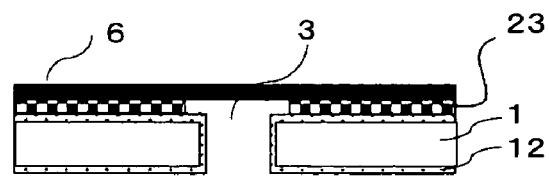
FIG. 16 is a cross-sectional view showing a step subsequent to FIG. 5 in the method according to the present invention.

In the method for producing a circuit board according to the fourth aspect of the present invention, resist patterns are sequentially formed on both surfaces as follows, and a circuit board is produced by the subtractive method. As a method for forming a resist pattern, any of the methods according to the first aspect of the present invention is used. First, there is prepared an insulating substrate 1 having a through-hole 3 as shown in FIG. 3, which has a conductive layer 12 on a first surface, on a second surface opposite to the first surface and on an inner wall of the through-hole 3. Subsequently, a first resin layer 21 and a mask layer 6 are formed on the first surface to cover the conductive layer 12 and an opening of the through-hole 3 on the first surface with the first resin layer 21 and the mask layer 6 (FIG. 4). Thereafter, a first resin layer removing solution is supplied from the surface opposite to the first surface (second surface) to remove the first resin layer 21 on the through-hole 3 and on a periphery of the through-hole 3 on the first surface (FIG. 5). Here, the amount of the removed first resin layer 21 on the through-hole 3 and on the periphery of the through-hole 3 on the first surface can be adjusted and the width of the uncovered conductive layer 12 can be controlled. Thereafter, a treatment for provision of resistance is provided to the first resin layer 21 and a first resin layer 23 after a treatment for provision of resistance is formed, which provides resistance against a subsequent second resin layer removing solution (FIG. 16).

Figure 17:
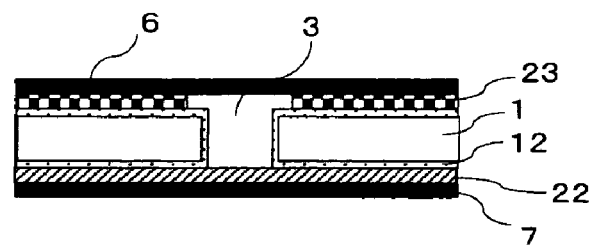
FIG. 17 is a cross-sectional view showing a step subsequent to FIG. 16 in the method according to the present invention.
Figure 18:
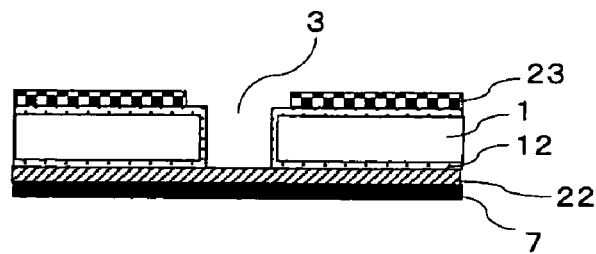
FIG. 18 is a cross-sectional view showing a step subsequent to FIG. 17 in the method according to the present invention.
Figure 19:
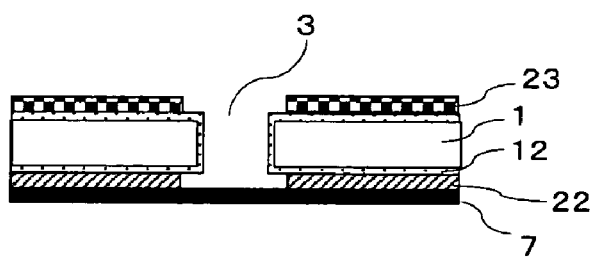
FIG. 19 is a cross-sectional view showing a step subsequent to FIG. 18 in the method according to the present invention.
Figure 20:
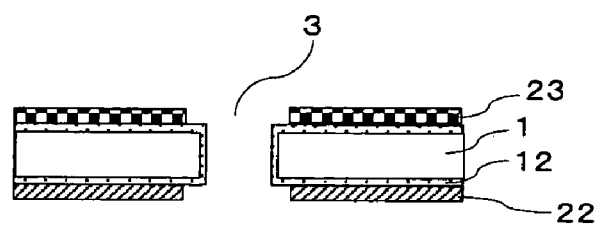
FIG. 20 is a cross-sectional view showing a step subsequent to FIG. 19 in the method according to the present invention.
Figure 21:
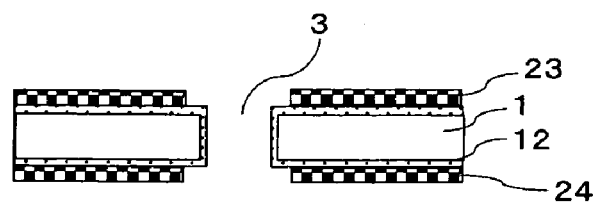
FIG. 21 is a cross-sectional view showing a step subsequent to FIG. 20 in the method according to the present invention.

A second resin layer 22 and a mask layer 7 are also formed on the second surface by the same method as used for the first surface (FIG. 17). After removing the first surface mask layer 6 (FIG. 18), a removing solution is supplied from the first surface to dissolve and to remove the second resin layer 22 on the through-hole 3 and on the periphery of the through-hole 3 on the second surface through the through-hole 3 (FIG. 19). Here, the amount of the removed second resin layer 22 on the through-hole 3 and on the periphery of the through-hole 3 on the second surface can be adjusted and the width of the uncovered conductive layer 12 can be controlled in the same manner as in the treatment of the first surface. Washing and drying are performed where necessary, and then the second surface mask layer 7 is removed (FIG. 20). This makes it possible to prepare a resin-adhered opening substrate having an opening width controlled to a desired value. Thereafter, a circuit board having a landless or small-land-width hole can be prepared by a series of steps in which a plugging ink step, a conductive ink filling step, an electrodeposition step, a metal plating step, a resist forming step and an etching step are appropriately combined. When the second resin layer and/or the first resin layer are undermined by a treatment solution in the subsequent step, it is possible to provide the second resin layer and/or the first resin layer with a treatment for provision of resistance against the subsequent step as necessary, respectively (FIG. 21).

The first surface mask layer 6 may be removed before providing the first resin layer with a treatment for provision of resistance or after forming the second resin layer and the mask layer on the second surface. Accordingly, it is expected that an uncertainty due to the mask layer can be eliminated and the first surface mask layer 6 can also have a protective function, advantageously.

In the method for producing a circuit board (16) according to the present invention, a resin-adhered opening substrate is prepared by the method for producing a circuit board according to the fourth aspect of the present invention, and then a circuit board is prepared by the subtractive method.

Figure 22:
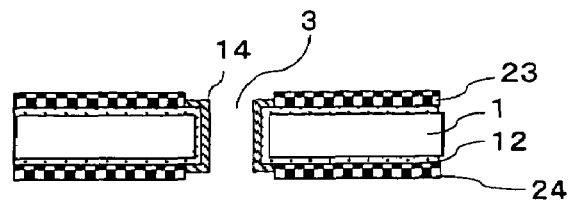
FIG. 22 is a cross-sectional view showing a step subsequent to FIG. 21 in the method according to the present invention.
Figure 23:
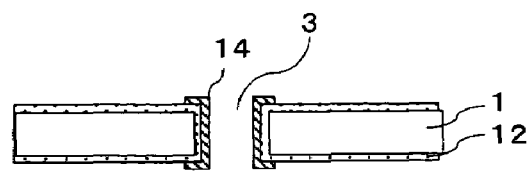
FIG. 23 is a cross-sectional view showing a step subsequent to FIG. 22 in the method according to the present invention.
Figure 24:
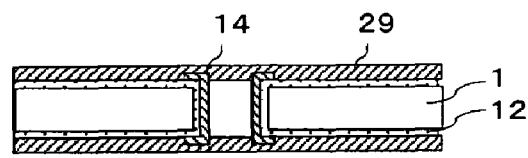
FIG. 24 is a cross-sectional view showing a step subsequent to FIG. 23 in the method according to the present invention.
Figure 25:
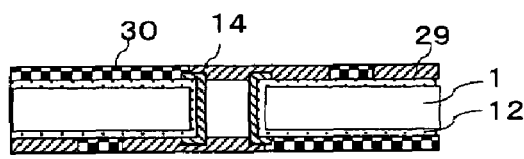
FIG. 25 is a cross-sectional view showing a step subsequent to FIG. 24 in the method according to the present invention.
Figure 26:
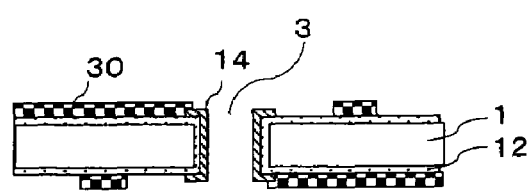
FIG. 26 is a cross-sectional view showing a step subsequent to FIG. 25 in the method according to the present invention.

An etching resist layer 14 is formed on the uncovered conductive layer of the resin-adhered opening substrate (FIG. 22). Thereafter, the resin layers on the first surface and the second surface is removed (FIG. 23), and then a photocrosslinkable resin layer 29 is formed on the first surface and the second surface (FIG. 24). Subsequently, the photocrosslinkable resin layer 29 is photocrosslinking cured in a pattern by pattern exposure (FIG. 25). Here, since the land is already protected by the etching resist layer 14, it is not necessary to expose the land. Subsequently, an uncured part is removed by development to form an etching resist layer composed of a photocrosslinking cured photocrosslinkable resin 30 (FIG. 26).

Figure 27:
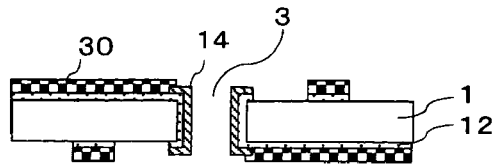
FIG. 27 is a cross-sectional view showing a step subsequent to FIG. 26 in the method according to the present invention.
Figure 28:
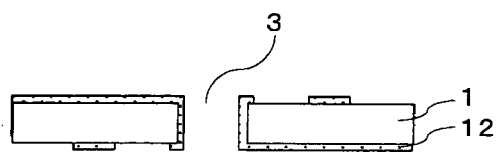
FIG. 28 is a cross-sectional view showing a step subsequent to FIG. 27 in the method according to the present invention.

Next, the uncovered part of the conductive layer 12 is removed by etching (FIG. 27). Finally, the etching resist layer 14 on the through-hole 3 and the etching resist layer composed of the photocrosslinking cured photocrosslinkable resin 30 on the surface are removed to prepare a circuit board (FIG. 28).

Method for Producing Circuit Board by Subtractive Method—2

Figure 29:
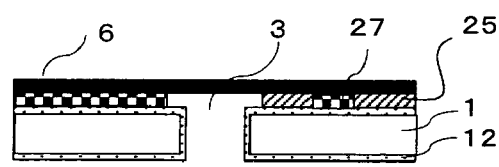
FIG. 29 is a cross-sectional view showing a step subsequent to FIG. 5 in the method according to the present invention.

In the method for producing a circuit board according to the fifth aspect of the present invention, resist patterns are sequentially formed on both surfaces as follows, and a circuit board is produced by the subtractive method. As a method for forming a resist pattern, any of the methods according to the first aspect of the present invention is used. First, there is prepared an insulating substrate 1 having a through-hole 3 as shown in FIG. 3, which has a conductive layer 12 on a first surface, on a second surface opposite to the first surface and on an inner wall of the through-hole 3. Thereafter, a photocrosslinkable resin layer 25 is formed on the first surface to tent the through-hole 3 (FIG. 4). Here, a mask layer 6 is formed on and in contact with the photocrosslinkable resin layer 25. Then, a photocrosslinkable resin layer removing solution is supplied from a second surface opposite to the first surface to dissolve and to remove the photocrosslinkable resin layer 25 on the through-hole 3 and on a periphery of the through-hole 3 on the first surface (FIG. 5). The amount of the removed photocrosslinkable resin layer 25 on the through-hole 3 and on the periphery of the through-hole 3 can be adjusted and the width of the uncovered conductive layer can be controlled by adjusting the removing conditions such as the type and concentration of the photocrosslinkable resin layer removing solution, the removing time and temperature, and the spray pressure and discharge amount of the removing solution when a spray is used. Accordingly, the land width can be controlled to form a landless, a narrow land or a broad land. Washing and drying are performed where necessary, and then the first surface photocrosslinkable resin layer 25 is subjected to pattern exposure. The photocrosslinkable resin layer in a non-circuit part is photocrosslinking cured by the pattern exposure (FIG. 29).

Figure 30:
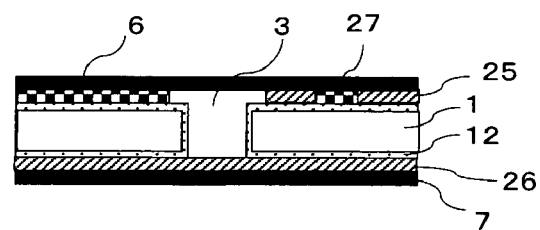
FIG. 30 is a cross-sectional view showing a step subsequent to FIG. 29 in the method according to the present invention.
Figure 31:
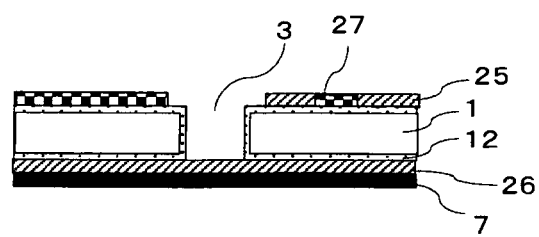
FIG. 31 is a cross-sectional view showing a step subsequent to FIG. 30 in the method according to the present invention.
Figure 32:
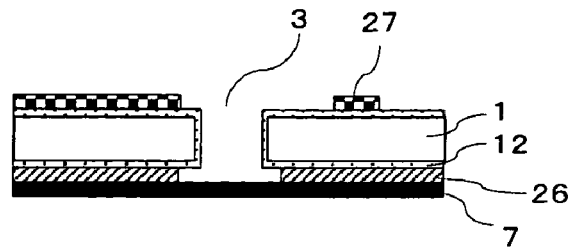
FIG. 32 is a cross-sectional view showing a step subsequent to FIG. 31 in the method according to the present invention.
Figure 33:
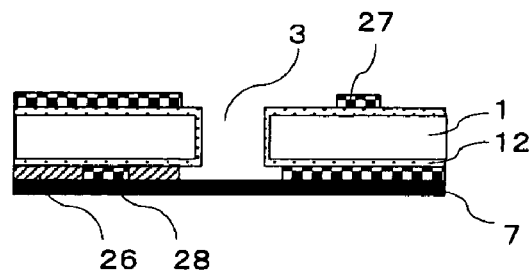
FIG. 33 is a cross-sectional view showing a step subsequent to FIG. 32 in the method according to the present invention.

A photocrosslinkable resin layer 26 and a mask layer 7 are also formed on the second surface by the same method as used for the first surface (FIG. 30). After removing the first surface mask layer 6 (FIG. 31), treatment using a photocrosslinkable resin layer removing solution is performed again. The photocrosslinkable resin layer removing solution is supplied at least from the first surface to dissolve and to remove an uncured photocrosslinkable resin layer 25 on the first surface, and to dissolve and to remove the photocrosslinkable resin layer 26 on the through-hole 3 and on the periphery of the through-hole 3 on the second surface through the through-hole 3 (FIG. 32). Here, the amount of the removed photocrosslinkable resin layer 26 on the through-hole 3 and on the periphery of the through-hole 3 on the second surface can be adjusted and the width of the uncovered conductive layer 12 can be controlled in the same manner as in the treatment of the first surface. Washing and drying are performed where necessary, and then the second surface photocrosslinkable resin layer 26 is subjected to pattern exposure to photocrosslinking cure the photocrosslinkable resin layer in a non-circuit part (FIG. 33).

The first surface mask layer 6 may be removed before subjecting the first surface photocrosslinkable resin layer 25 to pattern exposure or before forming the photocrosslinkable resin layer 26 and the mask layer on the second surface, if the removal is performed after removing the photocrosslinkable resin layer on the through-hole 3 and on the periphery of the through-hole 3 on the first surface. When the first surface may be damaged or contaminated in the formation of the photocrosslinkable resin layer 26 and the mask layer on the second surface, it is preferable to remove the first surface mask layer 6 after forming the photocrosslinkable resin layer 26 and the mask layer on the second surface, because the first surface after pattern exposure can be protected by the mask layer. On the other hand, it is possible to remove the first surface mask layer 6 and then perform drying, exposure or the like, after treatment with the photocrosslinkable resin layer removing solution from the second surface. Further, it is possible to form the photocrosslinkable resin layer and the mask layer on the second surface and then remove the photocrosslinkable resin layer on the through-hole 3 and on the periphery of the through-hole 3 on the second surface, after removing the uncured photocrosslinkable resin layer on the first surface.

Figure 34:
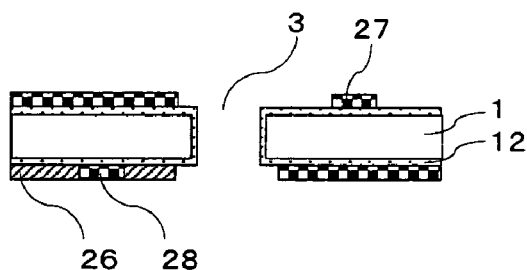
FIG. 34 is a cross-sectional view showing a step subsequent to FIG. 33 in the method according to the present invention.
Figure 35:
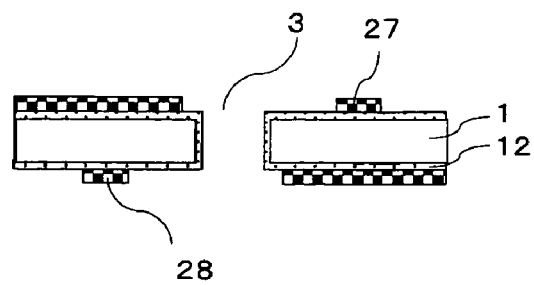
FIG. 35 is a cross-sectional view showing a step subsequent to FIG. 34 in the method according to the present invention.

After removing the pattern exposed second surface mask layer 7 (FIG. 34), treatment using a photocrosslinkable resin layer removing solution is performed. The photocrosslinkable resin layer removing solution is supplied at least from the second surface to dissolve and to remove an uncured photocrosslinkable resin layer 26 on the second surface (FIG. 35).

Figure 36:
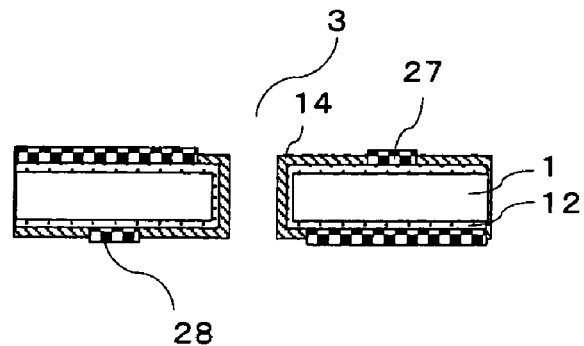
FIG. 36 is a cross-sectional view showing a step subsequent to FIG. 35 in the method according to the present invention.
Figure 37:
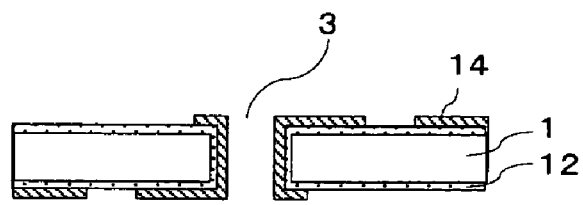
FIG. 37 is a cross-sectional view showing a step subsequent to FIG. 36 in the method according to the present invention.
Figure 38:
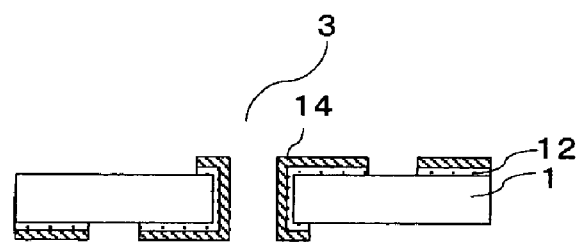
FIG. 38 is a cross-sectional view showing a step subsequent to FIG. 37 in the method according to the present invention.
Figure 39:
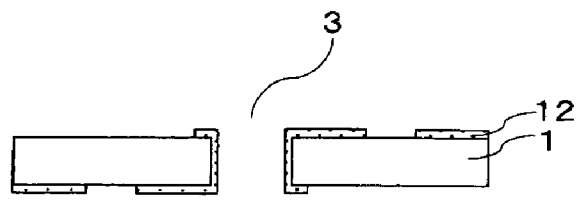
FIG. 39 is a cross-sectional view showing a step subsequent to FIG. 38 in the method according to the present invention.

Accordingly, photocrosslinking cured photocrosslinkable resin layers 27 and 28 can be formed in a pattern on both the first surface and the second surface. Then, an etching resist layer 14 is formed on the uncovered conductive layer 12 (FIG. 36). Thereafter, the photocrosslinking cured photocrosslinkable resin layers 27 and 28 on the first surface and the second surface are removed (FIG. 37), and the uncovered conductive layer 12 is etched to form a circuit pattern by the conductive layer (FIG. 38). The etching resist layer 14 is removed to produce a circuit board (FIG. 39).

Materials and Steps

The (first) resin layer and the second resin layer according to the present invention (hereinafter collectively called "resin layer") are not particularly limited insofar as they can be dissolved and removed using a (first) resin layer removing solution and a second resin layer removing solution (hereinafter collectively called "resin layer removing solution"). It is possible to use resins such as acrylic resins, vinyl acetate resins, vinyl chloride resins, vinylidene chloride resins, vinyl acetal resins such as polyvinyl butyral, polystyrene, polyethylene, polypropylene and their chlorides, polyester resins such as polyethylene terephthalate and polyethylene isophthalate, polyamide resins, vinyl-modified alkyd resins, phenolic resins, xylene resins, polyimide resins, epoxy resins, gelatin, and cellulose ester derivatives such as carboxymethylcellulose. The photocrosslinkable resins described below can also be used as the resin layer. Solubility of the same kind of the aforementioned resin varies according to the difference in the type and amount of the functional group contained in the resin and the molecular weight.

When an aqueous alkaline solution is used as a resin layer removing solution, a resin highly soluble in an aqueous alkaline solution is used as the resin layer, so that the resin layer can be dissolved and removed using the resin layer removing solution. When an aqueous alkaline solution is used as a removing solution, a resin having an acid value of 1 mg KOH/g or more, and more preferably 10 mg KOH/g or more can be suitably used as the resin layer. When an aqueous alkaline solution is used as a removing solution, examples of the resin layer include a copolymer containing a monomer having a carboxylic acid group, methacrylamide, a phenolic hydroxyl group, a sulfonic acid group, a sulfonamide group, a sulfonimide group or a phosphonic acid group, and a phenolic resin and a xylene resin. Specific examples include copolymers of styrene, acrylate, methacrylate, vinyl acetate or vinyl benzoate and the carboxylic acid-containing monomer such as a styrene/monoalkyl maleate copolymer, a methacrylic acid/methacrylate copolymer, a styrene/methacrylic acid/methacrylate copolymer, an acrylic acid/methacrylate copolymer, a methacrylic acid/methacrylate/acrylate copolymer, a styrene/methacrylic acid/acrylate copolymer, a styrene/acrylic acid/methacrylate copolymer, a vinyl acetate/crotonic acid copolymer, a vinyl acetate/crotonic acid/methacrylate copolymer and a vinyl benzoate/acrylic acid/methacrylate copolymer. These resins may be used singly or in a mixture of two or more. Other additives may be added insofar as solubility in the removing solution is ensured.

Examples of the photocrosslinkable resin layer according to the present invention include a photocrosslinkable dry film photoresist for production of a circuit board. Examples are illustrated below, however any photocrosslinkable resin layer can be used insofar as it does not depart from the intent of the present invention. For example, it is possible to use a negative photosensitive resin composition composed of a binder polymer containing a carboxylic acid group, a photopolymerizable polyfunctional monomer, a photopolymerization initiator, a solvent and other additives. The ratio of these components added is determined according to the demanded properties such as sensitivity, resolution, hardness and tenting properties. Examples of the composition are described in "Photopolymer Handbook" (edited by The Technical Association of Photopolymers, Japan, Kogyo Chosakai Publishing Co., Ltd., 1989), "Photopolymer Technology" (edited by Tsuguo Yamamoto and Gentaro Nagamatsu, Nikkan Kogyo Shimbun Ltd., 1988) and the like. As a commercially available product, it is possible to use Riston of DuPont MRC DryFilm Ltd., PhoTech of Hitachi Chemical Co., Ltd., or Sunfort of Asahi Kasei EMD Corporation, for example. In a commercially available product, a photocrosslinkable resin film is held between a support film such as a polyester film and a protective film such as a polyethylene film.

The first resin layer according to the fourth aspect of the present invention can be provided with resistance by any treatment that makes the first resin layer insoluble or poorly soluble in a second resin layer removing solution. A treatment for hardening of curing with light or heat is suitably used because of its simplicity. A photocrosslinkable resin or a thermosetting resin can be used as the first resin layer.

In the fourth aspect of the present invention, when an aqueous alkaline solution is used as a resin layer removing solution, the first resin layer used is an alkali-soluble resin and is provided with a photocrosslinkable component, so that the first resin layer can be dissolved in a first resin layer removing solution and can be insoluble or poorly soluble in a second resin layer removing solution after the treatment for provision of resistance. On the other hand, a thermosetting component such as an epoxy resin is provided and the treatment for provision of resistance is performed by thermal treatment, so that the first resin layer is dissolved in a first resin layer removing solution before the treatment for provision of resistance but can be insoluble or poorly soluble in a second resin layer removing solution after the treatment for provision of resistance. When a solution having a pH lower than that of a first resin layer removing solution is used as a second resin layer removing solution, the first resin layer can be insoluble in the second resin layer removing solution even if the treatment for provision of resistance is not provided to the first resin layer. In this case, it is possible that the treatment for provision of resistance is not provided to the first resin layer.

The second resin layer according to the fourth aspect of the present invention must be a resin having resistance against a treatment solution in the step after preparing a resin-adhered opening substrate. A treatment for provision of resistance is performed by photoirradiation, thermal treatment or the like where necessary. When pattern plating is used to form an etching resist layer, a resin that has resistant to the plating solution is used.

As the mask layer according to the present invention, it is possible to use a resin, a metal or the like insoluble or poorly soluble in a resin layer removing solution or a photocrosslinkable resin layer removing solution. As the resin, it is possible to use resins such as acrylic resins, vinyl acetate resins, vinyl chloride resins, vinylidene chloride resins, vinyl acetal resins such as polyvinyl butyral, polystyrene, polyethylene, polypropylene and their chlorides, polyester resins such as polyethylene terephthalate and polyethylene isophthalate, polyamide resins, vinyl-modified alkyd resins, phenolic resins, xylene resins, polyimide resins, gelatin, and cellulose ester derivatives such as carboxymethylcellulose. Polyester resins, polyimide resins and the like can be suitably used because of their general-purpose properties. Copper, aluminum or the like may be used as the metal. When pattern exposure for forming a resist pattern is performed through a mask layer, a light-transmissive resin is used so that the pattern exposure is not hindered. The mask layer is preferably a film integrally formed with the resin layer on a substrate, because the resin layer and the mask layer can be stably formed in a simple step. The aforementioned dry film photoresist is preferably used as a photocrosslinkable resin, because its support film can be directly used as the mask layer. Solubility of the same kind of the aforementioned resin varies according to the difference in the type and amount of the functional group contained in the resin and the molecular weight. When an aqueous alkaline solution is used as a resin layer removing solution, the aforementioned resin having low solubility in an aqueous alkaline solution is used as the mask layer, so that the mask layer is insoluble or poorly soluble in the resin layer removing solution. When an aqueous alkaline solution is used as a removing solution, a resin whose acid value is $1/10$ or less, and preferably $1/100$ or less that of the resin layer can be suitably used as the mask layer.

As the resin layer removing solution or the photocrosslinkable resin layer removing solution according to the present invention (hereinafter collectively called "removing solution"), a solution is used which can dissolve or disperse the resin layer or the photocrosslinkable resin layer and corresponds to the composition of the resin layer or the photocrosslinkable resin layer that is used. The removing solution removes the resin layer or the photocrosslinkable resin layer on a through-hole and on the periphery of the through-hole and forms a region in which the resin layer or the photocrosslinkable resin layer is not present on the through-hole and on the periphery of the through-hole. The removal of the resin layer or the photocrosslinkable resin layer on a through-hole means a state where at least part of the resin layer or the photocrosslinkable resin layer immediately on the through-hole is removed and an opening is formed on the through-hole. In the opening of the resin layer or the photocrosslinkable resin layer, the opening diameter in the upper part of the resin layer may be smaller than the diameter of the through-hole. The removing solution used is a solution not dissolving the mask layer, or a solution dissolving the mask layer, by which the mask layer is not swelled or changed in shape under the conditions where an appropriate amount of the resin layer or the photocrosslinkable resin layer is dissolved. Generally, an aqueous alkaline solution is usefully used. For example, it is possible to use an aqueous solution of an inorganic basic compound such as an alkali metal silicate, an alkali metal hydroxide, an alkali metal phosphate or carbonate, or ammonium phosphate or carbonate, or an organic basic compound such as ethanolamine, ethylenediamine, propanediamine, triethylenetetramine or morpholine. The concentration, temperature, spray pressure and the like of the aqueous solution must be adjusted to control solubility in the resin layer or the photocrosslinkable resin layer. The removing solution may be supplied by any method insofar as it can be supplied from a surface opposite to a surface having the mask layer to bring the removing solution into contact with the resin layer or the photocrosslinkable resin layer through the through-hole. A dipping apparatus, a double shower spray apparatus, a single shower spray apparatus or the like can be used. Removal of the resin layer or the photocrosslinkable resin layer can be immediately stopped by performing washing or acid treatment subsequent to treatment with the removing solution.

As a method for forming the resin layer or the photocrosslinkable resin layer according to the present invention integrally with the mask layer, it is possible to suitably use a method in which a dry film having the resin layer or the photocrosslinkable resin layer previously formed on a film support that is the mask layer is laminated on a substrate using a laminator.

As the insulating substrate according to the present invention, it is possible to use a paper base phenolic resin or glass base epoxy resin substrate, a polyester film, a polyimide film, a liquid crystal polymer film or the like. As the conductive layer, it is possible to use copper, silver, gold, aluminum, stainless steel, 42 alloy, nichrome, tungsten, ITO, a conductive polymer, various metal complexes or the like. Examples of these are described in "Print Kairo Gijutsu Binran (Printed Circuit Technology Overview)" (edited by Japan Printed Circuit Association, Nikkan Kogyo Shimbun Ltd., 1987).

Examples of the method for providing the (first) conductive layer on the insulating substrate according to the present invention include sputtering, vapor deposition, electroless plating, a method of bonding an extremely thin conductive layer such as a metal foil to the insulating substrate, and a method of forming a thin film by etching a conductive layer of a laminate having the conductive layer that is bonded. These methods may be used singly or in combination. It is possible to open a through-hole on the insulating substrate and then provide the (first) conductive layer on the surface of the insulating substrate and on the inner wall of the through-hole. Alternatively, it is possible to provide the (first) conductive layer on the surface of the insulating substrate, and then open a through-hole and provide the (first) conductive layer on the surface and on the inner wall of the through-hole again. The second conductive layer can be formed by electrolytic plating for the first conductive layer.

As the electroless plating or electrolytic plating according to the present invention, such treatment described in "Print Kairo Gijutsu Binran (Printed Circuit Technology Overview)" (edited by Japan Printed Circuit Association, Nikkan Kogyo Shimbun Ltd., 1987) can be used, for example.

In the method for producing a circuit board according to the present invention, the method for removing the photocrosslinking cured photocrosslinkable resin layer used as a plating resist layer or an etching resist layer may be a method of removing the layer using a high pH aqueous alkaline solution, an organic solvent or the like. Specific examples include an aqueous strong alkaline solution containing sodium hydroxide, potassium hydroxide, sodium metasilicate or the like, and an organic solvent such as an alcohol, ketone or the like.

Any etchant that can dissolve and remove the first conductive layer 12 may be used for flash etching of the first conductive layer according to the present invention. For example, it is possible to use a general etchant such as alkaline ammonia, sulfuric acid-hydrogen peroxide, cupric chloride, persulfate or ferric chloride. An apparatus or method such as horizontal spray etching or dip etching can be used, for example. The details for these are described in "Print Kairo Gijutsu Binran (Printed Circuit Technology Overview)" (edited by Japan Printed Circuit Association, Nikkan Kogyo Shimbun Ltd., 1987).

A method of electrodeposition or a plating method can be used as a method for forming the etching resist layer 14 on the conductive layer according to the methods for producing a circuit board according to the present invention. When copper is used as the conductive layer and a plating metal is used as the etching resist layer 14, it is possible to use gold, tin, a tin-lead solder alloy, nickel, a tin-nickel alloy, a nickel-gold alloy, silver, zinc, palladium, ruthenium, rhodium or the like. An electrodeposition resin can also be used as the etching resist layer. In this case, the resin has a charge to enable electrodeposition. Specifically, a polyimide resin, epoxy resin, acrylic resin, polyester resin, fluororesin or silicone resin emulsion can be used, for example. The charge retained may be anionic or cationic. Examples of the anionic charge include a carboxyl group, a sulfonic acid group, or an anion group thereof. Examples of the cationic charge include an amino group, a cation group thereof, and a quaternary ion group thereof.

The pattern exposure according to the present invention is performed by laser direct imaging, contact exposure through a photomask, proximity exposure, projection exposure or the like. As a light source, it is possible to use various laser light sources, as well as a ultra-high pressure mercury lamp, a high pressure mercury lamp, a metal halide lamp, a xenon lamp and the like. The photocrosslinkable resin in a circuit part or non-circuit part is photocrosslinking cured by the pattern exposure.

Any etchant that can dissolve and remove the conductive layer 12 may be used in the method for producing a circuit board by the subtractive method according to the present invention. For example, it is possible to use a general etchant such as an alkaline etchant such as alkaline ammonia, sulfuric acid-hydrogen peroxide, cupric chloride, persulfate or ferric chloride. When copper is used as the conductive layer, a metal plating etching resist is used for the through-hole, and a dry film photoresist is used in a surface wiring pattern as the etching resist layer, a commercially available alkaline etchant, ammonium persulfate, hydrogen peroxide/sulfuric acid or the like to which both etching resists are resistant and which can etch copper favorably is suitably used. An apparatus or method such as horizontal spray etching or dip etching can be used, for example. The details for these are described in "Print Kairo Gijutsu Binran (Printed Circuit Technology Overview)" (edited by Japan Printed Circuit Association, Nikkan Kogyo Shimbun Ltd., 1987).

In the method for producing a circuit board by the subtractive method according to the present invention, when a metal plating etching resist is used as the etching resist layer, the etching resist layer can be removed by an acid treatment solution such as a nitric acid, sulfuric acid or cyanide treatment solution which is commercially available for solder stripping. When an electrodeposition resin is used as the etching resist layer, the etching resist layer can be removed by an aqueous alkaline solution, an organic solvent or the like.

The present invention will be described in more detail below with reference to Examples; however, the present invention is not limited to the Examples.

EXAMPLES

Examples of Method for Producing Circuit Board by Semi-Additive Method

Example 1

Through-holes having a diameter of 0.1 mm were opened on a glass base epoxy resin substrate (area: 340 mm×510 mm, base thickness: 0.1 mm) using a drilling machine. Then, the substrate was subjected to desmear treatment and then electrolessly plated to provide an electroless copper plating layer having a thickness of about 0.5 μm as a first conductive layer on the surface including the inner wall of the each through-hole. A dry film photoresist for forming a circuit which is composed of a 25 μm photocrosslinkable resin layer and a 12 μm mask layer (support film, material: polyester) was thermocompression bonded to one surface (first surface) of the substrate using a dry film photoresist laminator to provide the photocrosslinkable resin layer and the mask layer (support film).

Then, a shower spray was applied from a second surface of the substrate at a spray pressure of 0.2 MPa for 32 seconds using a removing solution of a 1 mass % aqueous sodium carbonate solution (30° C.) to dissolve and to remove the photocrosslinkable resin layer on the each through-hole and on a periphery of the each through-hole on the first surface. The each through-hole and the periphery of the each through-hole were observed by an optical microscope and it was found that the photocrosslinkable resin layer on the periphery of the each through-hole was removed concentrically with the each through-hole. In various parameters for the each through-hole shown in FIG. 19, the each through-hole diameter L1 when the hole was formed was 100 μm, the each through-hole diameter L2 when plated was 99 μm, the diameter L3 of the part from which the photocrosslinkable resin layer was removed was 139 μm, and the diameter L4 of the upper part of the photocrosslinkable resin layer was 121 μm. The opening diameter of the part of the photocrosslinkable resin layer in contact with the first conductive layer was measured as the diameter L3 of the part from which the photocrosslinkable resin layer was removed. The opening of the part of the photocrosslinkable resin layer in contact with the mask layer was measured as the diameter L4 of the upper part of the photocrosslinkable resin layer.

A photomask with a circuit pattern drawn (conductor width and clearance: 35 μm) was placed on the first surface of the substrate. The substrate was subjected to UV pattern exposure for 30 seconds using a high pressure mercury lamp light source device for printing which has a suction contact mechanism (Unirec URM-300, manufactured by Ushio Inc.).

Then, the same dry film photoresist for forming a circuit which is the same as for the first surface was thermocompression bonded to the second surface of the substrate after completion of the exposure using a dry film photoresist laminator, thus a photocrosslinkable resin layer and a mask layer were provided. Thereafter, the mask layer on the first surface was stripped and removed.

Then, a shower spray was applied from the first surface of the substrate at a spray pressure of 0.2 MPa for 33 seconds using a removing solution of a 1 mass % aqueous sodium carbonate solution (30° C.) to remove the uncured part of the photocrosslinkable resin layer on the first surface, and to dissolve and to remove the photocrosslinkable resin layer on the each through-hole and on the periphery of the each through-hole on the second surface. The each through-hole and the periphery of the each through-hole on the second surface were observed by an optical microscope and it was found that the photocrosslinkable resin layer on the periphery of the each through-hole was removed concentrically with the each through-hole. The each through-hole diameter L1 when the hole was formed was 100 μm, the each through-hole diameter L2 when plated was 99 μm, the diameter L3 of the part from which the photocrosslinkable resin layer was removed was 139 μm, and the diameter L4 of the upper part of the photocrosslinkable resin layer was 121 μm.

A photomask with a circuit pattern drawn (conductor width and clearance: 35 μm) was placed on the second surface of the substrate. The substrate was subjected to UV pattern exposure for 30 seconds using a high pressure mercury lamp light source device for printing which has a suction contact mechanism (Unirec URM-300, manufactured by Ushio Inc.). Thereafter, the mask layer on the second surface was stripped and removed.

Then, a shower spray was applied from the second surface of the substrate at a spray pressure of 0.2 MPa for 25 seconds using a removing solution of a 1 mass % aqueous sodium carbonate solution (30° C.) to remove the part of the photocrosslinkable resin layer on the second surface.

The results of observing the resist pattern composed of the photocrosslinkable resin on the first surface and the second surface show that the resist pattern was formed on the each through-hole and on the periphery of the each through-hole to uncover the first conductive layer concentrically and accurately, and that the resist pattern on the surface of the substrate was also favorably formed.

Then, electrolytic copper plating was performed to form an electrolytic copper plating layer having a thickness of about 12 μm as a second conductive layer on the first conductive layer. Subsequently, treatment was performed with a 3 mass % aqueous sodium hydroxide solution to strip and to remove the crosslinked part of the photocrosslinkable resin used as a plating resist layer.

Further, treatment was performed with a sulfuric acid-hydrogen peroxide etchant (manufactured by Mitsubishi Gas Chemical Company, Inc., product name: CPE, 30° C., spray pressure: 0.2 MPa) to remove the uncovered first conductive layer. The resulting circuit board was observed by an optical microscope and it was found that the land was formed concentrically with the each through-hole. After flash etching as shown in FIG. 20, the each through-hole diameter L5 was 76 μm, the land diameter L6 was 138 μm, and the land width was 19 μm. The circuit board had no disconnection, and a favorable small-land-width circuit board was able to be produced. The circuit board was favorably provided with a solder resist without occurrence of a problem of an extremely thin solder resist in the top of the land conductive layer.

The cross-section of the circuit board was observed and the land diameter was examined in detail. The results show that the land edge on the bottom of the land (the surface in contact with the insulating substrate) had a land diameter L6 of 138 μm, the land top on the top of the land (the contour of the highest part of the land conductive layer) had a land diameter L7 of 129 μm, and the outer side surface of the land conductive layer had an inclination angle X of 70 degrees. In the cross-sectional shape of the circuit conductive layer, the top width and the bottom width of the wiring were each 34 μm. The side surface of the circuit conductive layer had an inclination angle Y of 90 degrees.

Example 2

A circuit board was prepared in the same manner as in Example 1, except that the time for treatment with a removing solution of a 1 mass % aqueous sodium carbonate solution (30° C.) was shortened to 26 seconds for the first surface and 28 seconds for the second surface when the photocrosslinkable resin layer on the each through-hole and on the periphery of the each through-hole on the first surface and the second surface was dissolved and removed in Example 1.

The each through-hole and the periphery of the each through-hole immediately before electrolytic copper plating were observed by an optical microscope for the first surface and the second surface, respectively, and it was found that the photocrosslinkable resin layer on the periphery of the each through-hole was removed concentrically with the each through-hole. The each through-hole diameter L1 when the hole was formed was 100 μm, the each through-hole diameter L2 when plated was 99 μm, the diameter L3 of the part from which the photocrosslinkable resin layer was removed was 115 μm, and the diameter L4 of the upper part of the photocrosslinkable resin layer was 86 μm.

The same treatment as in Example 1 was performed. The resulting circuit board was observed by an optical microscope after flash etching and it was found that the land was removed concentrically with the each through-hole. After flash etching, the each through-hole diameter L5 was 76 μm, the land diameter L6 was 114 μm, and the land width was 7 μm. The circuit board had no disconnection, and a favorable small-land-width circuit board was able to be produced. The circuit board was favorably provided with a solder resist without occurrence of a problem of an extremely thin solder resist in the top of the land conductive layer.

The cross-section of the circuit board was observed and the land diameter was examined in detail. The results show that the land edge on the bottom of the land (the surface in contact with the insulating substrate) had a land diameter L6 of 114 μm, the land top on the top of the land (the contour of the highest part of the land conductive layer) had a land diameter L7 of 100 μm, and the outer side surface of the land conductive layer had had an inclination angle X of 60 degrees. In the cross-sectional shape of the circuit conductive layer, the top width and the bottom width of the wiring were each 34 μm. The side surface of the circuit conductive layer had an inclination angle Y of 90 degrees.

Example 3

A circuit board was prepared in the same manner as in Example 1, except that the time for treatment with a removing solution of a 1 mass % aqueous sodium carbonate solution (30° C.) was extended to 50 seconds for both the first surface and the second surface when the photocrosslinkable resin layer on the each through-hole and on the periphery of the each through-hole on the first surface and the second surface was dissolved and removed in Example 1.

The each through-hole and the periphery of the each through-hole immediately before electrolytic copper plating were observed by an optical microscope for the first surface and the second surface, respectively, and it was found that the photocrosslinkable resin layer on the periphery of the each through-hole was removed concentrically with the each through-hole. The each through-hole diameter L1 when the hole was formed was 100 μm, the each through-hole diameter L2 when plated was 99 μm, the diameter L3 of the part from which the photocrosslinkable resin layer was removed was 149 μm, and the diameter L4 of the upper part of the photocrosslinkable resin layer was 140 μm.

The same treatment as in Example 1 was performed. The resulting circuit board was observed by an optical microscope after flash etching and it was found that the land was removed concentrically with the each through-hole. After flash etching, the each through-hole diameter L5 was 76 μm, the land diameter L6 was 148 μm, and the land width was 24 μm. The circuit board had no disconnection, and a favorable small-land-width circuit board was able to be produced. The circuit board was favorably provided with a solder resist without occurrence of a problem of an extremely thin solder resist in the top of the land conductive layer.

The cross-section of the circuit board was observed and the land diameter was examined in detail. The results show that the land edge on the bottom of the land (the surface in contact with the insulating substrate) had a land diameter L6 of 148 μm, the land top on the top of the land (the contour of the highest part of the land conductive layer) had a land diameter L7 of 144 μm, and the outer side surface of the land conductive layer had had an inclination angle X of 80 degrees. In the cross-sectional shape of the circuit conductive layer, the top width and the bottom width of the wiring were each 34 μm. The side surface of the circuit conductive layer had an inclination angle Y of 90 degrees.

Example 4

A circuit board was prepared in the same manner as in Example 1, except that a dry film photoresist for forming a circuit which is composed of a 40 μm photocrosslinkable resin layer and a 12 μm mask layer (support film, material: polyester) was used, and the time for treatment with a removing solution of a 1 mass % aqueous sodium carbonate solution (30° C.) was extended to 88 seconds for both the first surface and the second surface when the photocrosslinkable resin layer on the each through-hole and on the periphery of the each through-hole on the first surface and the second surface was dissolved and removed in Example 1.

The each through-hole and the periphery of the each through-hole immediately before electrolytic copper plating were observed by an optical microscope for the first surface and the second surface, respectively, and it was found that the photocrosslinkable resin layer on the periphery of the each through-hole was removed concentrically with the each through-hole. The each through-hole diameter L1 when the hole was formed was 100 μm, the each through-hole diameter L2 when plated was 99 μm, the diameter L3 of the part from which the photocrosslinkable resin layer was removed was 181 μm, and the diameter L4 of the upper part of the photocrosslinkable resin layer was 166 μm.

The same treatment as in Example 1 was performed. The resulting circuit board was observed by an optical microscope after flash etching and it was found that the land was removed concentrically with the each through-hole. After flash etching, the each through-hole diameter L5 was 76 μm, the land diameter L6 was 180 μm, and the land width was 40 μm. The circuit board had no disconnection, and a favorable small-land-width circuit board was able to be produced. The circuit board was favorably provided with a solder resist without occurrence of a problem of an extremely thin solder resist in the top of the land conductive layer.

The cross-section of the circuit board was observed and the land diameter was examined in detail. The results show that the land edge on the bottom of the land (the surface in contact with the insulating substrate) had a land diameter L6 of 180 μm, the land top on the top of the land (the contour of the highest part of the land conductive layer) had a land diameter L7 of 176 μm, and the outer side surface of the land conductive layer had had an inclination angle X of 80 degrees. In the cross-sectional shape of the circuit conductive layer, the top width and the bottom width of the wiring were each 34 μm. The side surface of the circuit conductive layer had an inclination angle Y of 90 degrees.

Examples of Method for Producing Circuit Board by Subtractive Method—1

Example 5

A plurality of through-holes having a diameter of 0.10 mm were formed by a drill on a 200×200×0.1 mm copper-clad laminate using a copper foil having a thickness of 12 μm. Electroless copper plating was performed to form an electroless copper plating layer having a thickness of about 0.5 μm on the surface and on the inner wall of the each through-hole. Thereafter, electrolytic copper plating was performed to form an electrolytic copper plating layer having a thickness of about 12 μm on the inner wall of the each hole and on the copper of the copper-clad laminate. Thus, an insulating substrate having a conductive layer in the each through-hole and on the surface was prepared.

Subsequently, a dry film photoresist for forming a circuit which is composed of a 25 μm photocrosslinkable resin layer and a 12 μm mask layer (support film, material: polyester) was thermocompression bonded to one surface (first surface) of the substrate using a dry film photoresist laminator to provide the first resin layer (photocrosslinkable resin layer) and the mask layer (support film).

Then, a shower spray was applied from a second surface of the substrate at a spray pressure of 0.2 MPa for 50 seconds using a first resin layer removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 110 μm.

Then, the whole surface of the first resin layer on the first surface was exposed using a high pressure mercury lamp light source device for printing (Unirec URM-300, manufactured by Ushio Inc.) for 45 seconds to photocrosslinking cure the whole surface. Thus, the first resin layer was provided with a treatment for provision of resistance to a subsequent second resin layer removing solution.

Then, the same dry film photoresist for forming a circuit which is the same as what is used for the first surface was thermocompression bonded to the second surface of the substrate after completion of the exposure using a dry film photoresist laminator, thus a second resin layer and a mask layer were provided. Thereafter, the mask layer on the first surface was stripped and removed.

Then, a shower spray was applied from the first surface of the substrate at a spray pressure of 0.2 MPa for 50 seconds using a removing solution of a 1 mass % aqueous sodium carbonate solution (30° C.) to dissolve and to remove the second resin layer on the each through-hole and on the periphery of the each through-hole on the second surface. Thereafter, the mask layer on the second surface was removed and a resin-adhered opening substrate was produced. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 110 μm.

Example 6

A plurality of through-holes having a diameter of 0.10 mm were formed by a drill on a 200×200×0.1 mm copper-clad laminate using a copper foil having a thickness of 12 μm. Electroless copper plating was performed to form an electroless copper plating layer having a thickness of about 0.5 μm on the surface and on the inner wall of the each through-hole.

Subsequently, a dry film photoresist for forming a circuit which is composed of a 25 μm photocrosslinkable resin layer and a 12 μm mask layer (support film, material: polyester) was thermocompression bonded to one surface (first surface) of the substrate using a dry film photoresist laminator to provide the first resin layer (photocrosslinkable resin layer) and the mask layer (support film).

Then, a shower spray was applied from a second surface of the substrate at a spray pressure of 0.2 MPa for 32 seconds using a first resin layer removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 140 μm.

Then, the whole surface of the first resin layer on the first surface was exposed using a high pressure mercury lamp light source device for printing (Unirec URM-300, manufactured by Ushio Inc.) for 45 seconds to photocrosslinking cure the whole surface. Thus, the first resin layer was provided with a treatment for provision of resistance to a subsequent second resin layer removing solution.

Then, the same dry film photoresist for forming a circuit which is the same as what is used for the first surface was thermocompression bonded to the second surface of the substrate after completion of the exposure using a dry film photoresist laminator, thus a second resin layer and a mask layer were provided. Thereafter, the mask layer on the first surface was stripped and removed.

Then, a shower spray was applied from the first surface of the substrate at a spray pressure of 0.2 MPa for 33 seconds using a removing solution of a 1 mass % aqueous sodium carbonate solution (30° C.) to dissolve and to remove the second resin layer on the each through-hole and on the periphery of the each through-hole on the second surface. Thereafter, the mask layer on the second surface was removed and a resin-adhered opening substrate was produced. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 140 μm.

Then, the whole surface of the second resin layer on the second surface was exposed using a high pressure mercury lamp light source device for printing (Unirec URM-300, manufactured by Ushio Inc.) for 45 seconds to photocrosslinking cure the whole surface. Thus, resistance against subsequent electrolytic copper plating was increased.

Then, electrolytic copper plating was performed to form an electrolytic copper plating layer having a thickness of about 12 μm on the inner wall of the each hole and on the copper uncovered part of the surface. A resin-adhered opening substrate with an increased copper thickness on the inner wall of the each hole was produced without increasing the copper thickness of the circuit forming part on the surface.

Example 7

A plurality of through-holes having a diameter of 0.10 mm were formed by a drill on a 200×200×0.1 mm copper-clad laminate using a copper foil having a thickness of 12 μm. Electroless copper plating was performed to form an electroless copper plating layer having a thickness of about 0.5 μm on the surface and on the inner wall of the each through-hole. Thereafter, electrolytic copper plating was performed to form an electrolytic copper plating layer having a thickness of about 12 μm on the inner wall of the each hole and on the copper of the copper-clad laminate. Thus, an insulating substrate having a conductive layer in the each through-hole and on the surface was prepared.

Subsequently, a dry film photoresist for forming a circuit which is composed of a 25 μm photocrosslinkable resin layer and a 12 μm mask layer (support film, material: polyester) was thermocompression bonded to one surface (first surface) of the substrate using a dry film photoresist laminator to provide the first resin layer (photocrosslinkable resin layer) and the mask layer (support film).

Then, a shower spray was applied from a second surface of the substrate at a spray pressure of 0.2 MPa for 65 seconds using a first resin layer removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 126 μm.

Then, the whole surface of the first resin layer on the first surface was exposed using a high pressure mercury lamp light source device for printing (Unirec URM-300, manufactured by Ushio Inc.) for 45 seconds to photocrosslinking cure the whole surface. Thus, the first resin layer was provided with a treatment for provision of resistance to a subsequent second resin layer removing solution.

Then, the same dry film photoresist for forming a circuit which is the same as what is used for the first surface was thermocompression bonded to the second surface of the substrate after completion of the exposure using a dry film photoresist laminator, thus a second resin layer and a mask layer were provided. Thereafter, the mask layer on the first surface was stripped and removed.

Then, a shower spray was applied from the first surface of the substrate at a spray pressure of 0.2 MPa for 65 seconds using a removing solution of a 1 mass % aqueous sodium carbonate solution (30° C.) to dissolve and to remove the second resin layer on the each through-hole and on the periphery of the each through-hole on the second surface. Thereafter, the mask layer on the second surface was removed and a resin-adhered opening substrate was produced. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 126 μm.

Example 8

A plurality of through-holes having a diameter of 0.10 mm were formed by a drill on a 200×200×0.1 mm copper-clad laminate using a copper foil having a thickness of 12 μm. Electroless copper plating was performed to form an electroless copper plating layer having a thickness of about 0.5 μm on the surface and on the inner wall of the each through-hole. Thereafter, electrolytic copper plating was performed to form an electrolytic copper plating layer having a thickness of about 12 μm on the inner wall of the each hole and on the copper of the copper-clad laminate. Thus, an insulating substrate having a conductive layer in the each through-hole and on the surface was prepared.

Subsequently, a dry film photoresist for forming a circuit which is composed of a 25 μm photocrosslinkable resin layer and a 12 μm mask layer (support film, material: polyester) was thermocompression bonded to one surface (first surface) of the substrate using a dry film photoresist laminator to provide the first resin layer (photocrosslinkable resin layer) and the mask layer (support film).

Then, a shower spray was applied from a second surface of the substrate at a spray pressure of 0.2 MPa for 80 seconds using a first resin layer removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 138 μm.

Then, the whole surface of the first resin layer on the first surface was exposed using a high pressure mercury lamp light source device for printing (Unirec URM-300, manufactured by Ushio Inc.) for 45 seconds to photocrosslinking cure the whole surface. Thus, the first resin layer was provided with a treatment for provision of resistance to a subsequent second resin layer removing solution.

Then, the same dry film photoresist for forming a circuit which is the same as what is used for the first surface was thermocompression bonded to the second surface of the substrate after completion of the exposure using a dry film photoresist laminator, thus a second resin layer and a mask layer were provided. Thereafter, the mask layer on the first surface was stripped and removed.

Then, a shower spray was applied from the first surface of the substrate at a spray pressure of 0.2 MPa for 80 seconds using a removing solution of a 1 mass % aqueous sodium carbonate solution (30° C.) to dissolve and to remove the second resin layer on the each through-hole and on the periphery of the each through-hole on the second surface. Thereafter, the mask layer on the second surface was removed and a resin-adhered opening substrate was produced. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 138 µm.

Example 9

The whole second surface of the resin-adhered opening substrate obtained in Example 5 was exposed using a high pressure mercury lamp light source device for printing (Unirec URM-300, manufactured by Ushio Inc.) for 45 seconds to photocrosslinking cure the whole surface. Thus, the second surface was provided with a treatment for provision of resistance to a treatment solution for subsequent formation of an etching resist layer. Then, a tin plating was formed as an etching resist layer on the uncovered copper surface using a tin plating solution (Solderon SN-2670 manufactured by Meltex Inc.).

Then, the photocrosslinking cured photocrosslinkable first and second resin layers were removed by a 3 mass % aqueous sodium hydroxide solution (30° C.)

Subsequently, a dry film photoresist for forming a circuit which is composed of a 15 µm photocrosslinkable resin layer and a 12 µm mask layer (support film, material: polyester) was thermocompression bonded to each surface of the substrate. A photomask with a wiring pattern drawn (conductor width and clearance: 40 µm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the support film on each surface was removed, and then alkaline development using a 1 mass % aqueous sodium carbonate solution (30° C.) was performed to form an etching resist layer composed of a photocrosslinking cured photocrosslinkable resin on each surface of the substrate.

Then, the uncovered copper was removed using an ammonia alkaline etchant (A-Process manufactured by Meltex Inc.) as an etchant. Thereafter, the etching resist layer composed of the photocrosslinking cured photocrosslinkable resin was removed by a 3 mass % aqueous sodium hydroxide solution (30° C.). Subsequently, the tin plating on the copper was stripped by using a treatment solution only for stripping a tin plating (Enstrip TL manufactured by Meltex Inc.) to produce a circuit board. The circuit board was observed by a microscope and it was found that the land was formed concentrically with the each through-hole. The land width Lw was 5 µm. The circuit board had no disconnection, and a favorable small-land-width circuit board was able to be produced.

Example 10

A tin plating was formed as an etching resist layer on the uncovered copper surface of the resin-adhered opening substrate obtained in Example 6 using a tin plating solution (Solderon SN-2670 manufactured by Meltex Inc.).

Then, the photocrosslinking cured photocrosslinkable first and second resin layers were removed by a 3 mass % aqueous sodium hydroxide solution (30° C.)

Subsequently, a dry film photoresist for forming a circuit which is composed of a 15 µm photocrosslinkable resin layer and a 12 µm mask layer (support film, material: polyester) was thermocompression bonded to each surface of the substrate. A photomask with a wiring pattern drawn (conductor width and clearance: 30 µm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the support film on each surface was removed, and then alkaline development using a 1 mass % aqueous sodium carbonate solution (30° C.) was performed to form an etching resist layer composed of a photocrosslinking cured photocrosslinkable resin on each surface of the substrate.

Then, the uncovered copper was removed using an ammonia alkaline etchant (A-Process manufactured by Meltex Inc.) as an etchant. Thereafter, the etching resist layer composed of the photocrosslinking cured photocrosslinkable resin was removed by a 3 mass % aqueous sodium hydroxide solution (30° C.). Subsequently, the tin plating on the copper was stripped by using a treatment solution only for stripping a tin plating (Enstrip TL manufactured by Meltex Inc.) to produce a circuit board. The circuit board was observed by a microscope and it was found that the land was formed concentrically with the each through-hole. The land width Lw was 20 µm. The circuit board had no disconnection, and a favorable small-land-width circuit board was able to be produced.

Example 11

The whole second surface of the resin-adhered opening substrate obtained in Example 7 was exposed using a high pressure mercury lamp light source device for printing (Unirec URM-300, manufactured by Ushio Inc.) for 45 seconds to photocrosslinking cure the whole surface. Thus, the second surface was provided with a treatment for provision of resistance to a treatment solution for subsequent formation of an etching resist layer. Then, a tin plating was formed as an etching resist layer on the uncovered copper surface using a tin plating solution (Solderon SN-2670 manufactured by Meltex Inc.).

Then, the photocrosslinking cured photocrosslinkable first and second resin layers were removed by a 3 mass % aqueous sodium hydroxide solution (30° C.)

Subsequently, a dry film photoresist for forming a circuit which is composed of a 15 µm photocrosslinkable resin layer and a 12 µm mask layer (support film, material: polyester) was thermocompression bonded to each surface of the substrate. A photomask with a wiring pattern drawn (conductor width and clearance: 40 µm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the support film on each surface was removed, and then alkaline development using a 1 mass % aqueous sodium carbonate solution (30° C.) was performed to form an etching resist layer composed of a photocrosslinking cured photocrosslinkable resin on each surface of the substrate.

Then, the uncovered copper was removed using an ammonia alkaline etchant (A-Process manufactured by Meltex Inc.) as an etchant. Thereafter, the etching resist layer composed of the photocrosslinking cured photocrosslinkable resin was removed by a 3 mass % aqueous sodium hydroxide solution (30° C.). Subsequently, the tin plating on the copper was stripped by using a treatment solution only for stripping a tin plating (Enstrip TL manufactured by Meltex Inc.) to produce a circuit board. The circuit board was observed by a microscope and it was found that the land was formed concentrically with the each through-hole. The land width Lw was 13

μm. The circuit board had no disconnection, and a favorable small-land-width circuit board was able to be produced.

Example 12

The whole second surface of the resin-adhered opening substrate obtained in Example 8 was exposed using a high pressure mercury lamp light source device for printing (Unirec URM-300, manufactured by Ushio Inc.) for 45 seconds to photocrosslinking cure the whole surface. Thus, the second surface was provided with a treatment for provision of resistance to a treatment solution for subsequent formation of an etching resist layer. Then, a tin plating was formed as an etching resist layer on the uncovered copper surface using a tin plating solution (Solderon SN-2670 manufactured by Meltex Inc.).

Then, the photocrosslinking cured photocrosslinkable first and second resin layers were removed by a 3 mass % aqueous sodium hydroxide solution (30° C.)

Subsequently, a dry film photoresist for forming a circuit which is composed of a 15 μm photocrosslinkable resin layer and a 12 μm mask layer (support film, material: polyester) was thermocompression bonded to each surface of the substrate. A photomask with a wiring pattern drawn (conductor width and clearance: 40 μm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the support film on each surface was removed, and then alkaline development using a 1 mass % aqueous sodium carbonate solution (30° C.) was performed to form an etching resist layer composed of a photocrosslinking cured photocrosslinkable resin on each surface of the substrate.

Then, the uncovered copper was removed using an ammonia alkaline etchant (A-Process manufactured by Meltex Inc.) as an etchant. Thereafter, the etching resist layer composed of the photocrosslinking cured photocrosslinkable resin was removed by a 3 mass % aqueous sodium hydroxide solution (30° C.). Subsequently, the tin plating on the copper was stripped by using a treatment solution only for stripping a tin plating (Enstrip TL manufactured by Meltex Inc.) to produce a circuit board. The circuit board was observed by a microscope and it was found that the land was formed concentrically with the each through-hole. The land width Lw was 19 μm. The circuit board had no disconnection, and a favorable small-land-width circuit board was able to be produced.

Examples of Method for Producing Circuit Board by Subtractive Method—2

Example 13

Through-holes having a diameter of 0.10 mm were opened on a copper-clad laminate (area: 340 mm×510 mm, base thickness: 0.10 mm, copper thickness: 12 μm) using a drilling machine. Then, the laminate was subjected to desmear treatment and then electrolessly plated to provide an electroless copper plating layer having a thickness of about 0.5 μm as a conductive layer on the inner wall of the each through-hole. Then, a copper layer having a thickness of 12 μm was further formed on the inner wall of the each through-hole and on the surface by electrolytic plating. A dry film photoresist for forming a circuit which is composed of a 15 μm photocrosslinkable resin layer and a 12 μm mask layer (support film, material: polyester) was thermocompression bonded to one surface (first surface) of the substrate using a dry film photoresist laminator to provide the photocrosslinkable resin layer and the mask layer (support film).

Then, a shower spray was applied from a second surface of the substrate at a spray pressure of 0.2 MPa for 50 seconds using a removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 110 μm.

A photomask with a circuit pattern drawn (conductor width and clearance: 40 μm) was placed on the first surface of the substrate. The substrate was subjected to UV pattern exposure for 40 seconds using a high pressure mercury lamp light source device for printing which has a suction contact mechanism (Unirec URM-300, manufactured by Ushio Inc.).

Then, the same dry film photoresist for forming a circuit which is the same as for the first surface was thermocompression bonded to the second surface of the substrate after completion of the exposure using a dry film photoresist laminator, thus a photocrosslinkable resin layer and a mask layer were provided. Thereafter, the mask layer on the first surface was stripped and removed.

Then, a shower spray was applied from the first surface of the substrate at a spray pressure of 0.2 MPa for 50 seconds using a removing solution of a 1 mass % aqueous sodium carbonate solution (30° C.) to remove the uncured part of the photocrosslinkable resin layer on the first surface, and to dissolve and to remove the photocrosslinkable resin layer on the each through-hole and on the periphery of the each through-hole on the second surface. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 110 μm.

A photomask with a circuit pattern drawn (conductor width and clearance: 40 μm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the mask layer on the second surface was stripped and removed.

Then, a shower spray was applied from the second surface of the substrate at a spray pressure of 0.2 MPa for 20 seconds using a removing solution of a 1 mass % aqueous sodium carbonate solution (30° C.) to remove the uncured part of the photocrosslinkable resin layer on the second surface.

The results of observing the photocrosslinking cured photocrosslinkable resin layer in a pattern on the first surface and the second surface show that the pattern was formed on the each through-hole and on the periphery of the each through-hole to uncover the conductive layer concentrically and accurately, and that the pattern on the surface of the substrate was also favorably formed.

Then, a tin plating was formed as an etching resist layer on the uncovered copper surface using a tin plating solution (Solderon SN-2670 manufactured by Meltex Inc.). Subsequently, treatment was performed using a 3 mass % aqueous sodium hydroxide solution to strip and to remove the photocrosslinking cured photocrosslinkable resin layer, and to uncover the copper in the part other than the etching resist layer.

Further, the uncovered copper was removed using an ammonia alkaline etchant (A-Process manufactured by Meltex Inc.) as an etchant. Thereafter, the tin plating on the copper was stripped by using a treatment solution only for stripping a tin plating (Enstrip TL manufactured by Meltex Inc.) to produce a circuit board.

The circuit board was observed by a microscope and it was found that the land was formed concentrically with the each through-hole. The land width Lw was 5 µm. The circuit board had no disconnection, and a favorable small-land-width circuit board was able to be produced.

Example 14

A circuit board was produced in the same manner as in Example 13, except that the time for treatment with a photocrosslinkable resin layer removing solution of a 1 mass % aqueous sodium carbonate solution (30° C.) was 65 seconds for both the first surface and the second surface when the photocrosslinkable resin layer on the each through-hole and on the periphery of the each through-hole on the first surface and the second surface was dissolved and removed in Example 13.

When the photocrosslinkable resin layer on the each through-hole and on the periphery of the each through-hole on the first surface and the second surface was dissolved and removed, the copper uncovered part on the periphery of the each through-hole had an outside diameter of 126 µm for both the first surface and the second surface.

The circuit board after stripping and removing the etching resist layer was observed by an optical microscope and it was found that the land was removed concentrically with the each through-hole. The land width Lw was 13 µm. The circuit board had no disconnection, and a favorable small-land-width circuit board was able to be produced.

Example 15

A circuit board was produced in the same manner as in Example 13, except that the time for treatment with a photocrosslinkable resin layer removing solution of a 1 mass % aqueous sodium carbonate solution (30° C.) was 80 seconds for both the first surface and the second surface when the photocrosslinkable resin layer on the each through-hole and on the periphery of the each through-hole on the first surface and the second surface was dissolved and removed in Example 13.

When the photocrosslinkable resin layer on the each through-hole and on the periphery of the each through-hole on the first surface and the second surface was dissolved and removed, the copper uncovered part on the periphery of the each through-hole had an outside diameter of 138 µm for both the first surface and the second surface.

The circuit board after stripping and removing the etching resist layer was observed by an optical microscope and it was found that the land was removed concentrically with the each through-hole. The land width Lw was 19 µm. The circuit board had no disconnection, and a favorable small-land-width circuit board was able to be produced.

Example 16

A circuit board was produced in the same manner as in Example 13, except that the mask layer on the first surface was removed after exposing the first surface and before laminating the photocrosslinkable resin layer and the mask layer on the second surface in Example 13.

The circuit board was observed by a microscope and it was found that the land was formed concentrically with the each through-hole. The land width Lw was 5 µm. The circuit board had no disconnection, and a favorable small-land-width circuit board was able to be produced.

Example 17

A circuit board was produced in the same manner as in Example 13, except that the mask layer on the first surface was removed after dissolving and removing the photocrosslinkable resin layer on the each through-hole and on the periphery of the each through-hole on the first surface and before exposing the first surface in Example 13.

The circuit board was observed by a microscope and it was found that the land was formed concentrically with the each through-hole. The land width Lw was 5 µm. The circuit board had no disconnection, and a favorable small-land-width circuit board was able to be produced.

Example 18

Through-holes having a diameter of 0.10 mm were opened on a copper-clad laminate (area: 340 mm×510 mm, base thickness: 0.10 mm, copper thickness: 12 µm) using a drilling machine. Then, the laminate was subjected to desmear treatment and then electrolessly plated to provide an electroless copper plating layer having a thickness of about 0.5 µm as a conductive layer on the inner wall of the each through-hole. Then, a copper layer having a thickness of 12 µm was further formed on the inner wall of the each through-hole and on the surface by electrolytic plating. A dry film photoresist for forming a circuit which is composed of a 15 µm photocrosslinkable resin layer and a 12 µm mask layer (support film, material: polyester) was thermocompression bonded to one surface (first surface) of the substrate using a dry film photoresist laminator to provide the photocrosslinkable resin layer and the mask layer (support film).

Then, a shower spray was applied from a second surface of the substrate at a spray pressure of 0.2 MPa for 50 seconds using a removing solution of a 1 mass % aqueous sodium carbonate solution (30° C.) to dissolve and to remove the photocrosslinkable resin layer on the each through-hole and on the periphery of the each through-hole on the first surface. The each through-hole and the periphery of the each through-hole were observed by an optical microscope and it was found that the photocrosslinkable resin layer on the periphery of the each through-hole was removed concentrically with the each through-hole. The copper uncovered part on the periphery of the each through-hole had an outside diameter of 110 µm.

A photomask with a circuit pattern drawn (conductor width and clearance: 40 µm) was placed on the first surface of the substrate. The substrate was subjected to UV pattern exposure for 40 seconds using a high pressure mercury lamp light source device for printing which has a suction contact mechanism (Unirec URM-300, manufactured by Ushio Inc.).

Then, the mask layer on the first surface was stripped and removed. Thereafter, a shower spray was applied from the first surface of the substrate at a spray pressure of 0.2 MPa for 20 seconds using a removing solution of a 1 mass % aqueous sodium carbonate solution (30° C.) to remove the uncured part of the photocrosslinkable resin layer on the first surface.

Then, the same dry film photoresist for forming a circuit which is the same as for the first surface was thermocompression bonded to the second surface of the substrate using a dry film photoresist laminator, thus a photocrosslinkable resin layer and a mask layer were provided.

Then, a shower spray was applied from the first surface of the substrate at a spray pressure of 0.2 MPa for 50 seconds using a removing solution of a 1 mass % aqueous sodium carbonate solution (30° C.) to dissolve and to remove the photocrosslinkable resin layer on the each through-hole and on the periphery of the each through-hole on the second surface. The each through-hole and the periphery of the each through-hole on the second surface were observed by an optical microscope and it was found that the photocrosslinkable resin layer on the periphery of the each through-hole was removed concentrically with the each through-hole. The copper uncovered part on the periphery of the each through-hole had an outside diameter of 110 µm.

A photomask with a circuit pattern drawn (conductor width and clearance: 40 µm) was placed on the second surface of the substrate. The substrate was subjected to UV pattern exposure for 40 seconds using a high pressure mercury lamp light source device for printing which has a suction contact mechanism (Unirec URM-300, manufactured by Ushio Inc.). Thereafter, the mask layer on the second surface was stripped and removed.

Then, a shower spray was applied from the second surface of the substrate at a spray pressure of 0.2 MPa for 20 seconds using a removing solution of a 1 mass % aqueous sodium carbonate solution (30° C.) to remove the uncured part of the photocrosslinkable resin layer on the second surface.

The results of observing the photocrosslinking cured photocrosslinkable resin layer in a pattern on the first surface and the second surface show that the pattern was formed on the each through-hole and on the periphery of the each through-hole to uncover the conductive layer concentrically and accurately, and that the pattern on the surface of the substrate was also favorably formed.

Then, a tin plating was formed as an etching resist layer on the uncovered copper surface using a tin plating solution (Solderon SN-2670 manufactured by Meltex Inc.). Subsequently, treatment was performed using a 3 mass % aqueous sodium hydroxide solution to strip and to remove the photocrosslinking cured photocrosslinkable resin layer, and to uncover the copper in the part other than the etching resist layer.

Further, the uncovered copper was removed using an ammonia alkaline etchant (A-Process manufactured by Meltex Inc.) as an etchant. Thereafter, the tin plating on the copper was stripped by using a treatment solution only for stripping a tin plating (Enstrip TL manufactured by Meltex Inc.) to produce a circuit board.

The circuit board was observed by a microscope and it was found that the land was formed concentrically with the each through-hole. The land width Lw was 5 µm. The circuit board had no disconnection, and a favorable small-land-width circuit board was able to be produced.

Example 19

A circuit board was produced in the same manner as in Example 18, except that the mask layer on the first surface was removed after dissolving and removing the photocrosslinkable resin layer on the each through-hole and on the periphery of the each through-hole on the first surface and before exposing the first surface in Example 18.

The circuit board was observed by a microscope and it was found that the land was formed concentrically with the each through-hole. The land width Lw was 5 µm. The circuit board had no disconnection, and a favorable small-land-width circuit board was able to be produced.

INDUSTRIAL APPLICABILITY

The present invention can be used for producing a printed wiring board, or a circuit board for a semiconductor device or the like.

The invention claimed is:

1. A method for producing a circuit board, comprising the steps of:
   (a) preparing an insulating substrate having a through-hole(s), which has a first conductive layer on a first surface, on a second surface opposite to the first surface and on an inner wall of the through-holes(s);
   (b) covering the first conductive layer and an opening of the through-hole(s) on the first surface with a photocrosslinkable resin layer and a mask layer by forming the photocrosslinkable resin layer and the mask layer on the first surface;
   (c) uncovering the first conductive layer on the periphery of the through-hole(s) on the first surface by supplying a photocrosslinkable resin layer removing solution from the second surface and removing the photocrosslinkable resin layer on the through-hole(s) and on a periphery of the through-hole(s) on the first surface;
   (d) subjecting the photocrosslinkable resin layer on the first surface to pattern exposure;
   (e) covering the first conductive layer and an opening of the through-hole(s) on the second surface with a photocrosslinkable resin layer and a mask layer by forming the photocrosslinkable resin layer and the mask layer on the second surface;
   (f) removing the mask layer on the first surface;
   (g) uncovering the first conductive layer on the first surface and the first conductive layer on a periphery of the through-hole(s) on the second surface by supplying a photocrosslinkable resin layer removing solution from the first surface and removing an uncured photocrosslinkable resin layer on the first surface and the photocrosslinkable resin layer on the through-hole(s) and on the periphery of the through-hole(s) on the second surface;
   (h) subjecting the photocrosslinkable resin layer on the second surface to pattern exposure;
   (i) removing the mask layer on the second surface;
   (j) uncovering the first conductive layer on the second surface by supplying a photocrosslinkable resin layer removing solution from the second surface and removing an uncured photocrosslinkable resin layer on the second surface;
   (k) forming a second conductive layer on the first conductive layer uncovered on the inner wall of the through-hole(s) and the periphery of the through-hole(s) and on the first surface and the second surface by electrolytic plating;
   (l) uncovering the first conductive layer on the first surface and the second surface by removing the cured photocrosslinkable resin layers on the first surface and the second surface; and
   (m) removing the uncovered first conductive layer by flash etching.

2. The method for producing a circuit board according to claim 1, wherein the step (f) is performed before the step (e).

3. The method for producing a circuit board according to claim 1, wherein the step (f) is performed before the step (d).

4. The method for producing a circuit board according to claim 1, wherein the step (g) comprises the steps of (g1) uncovering the first conductive layer on the first surface by supplying the photocrosslinkable resin removing solution from the first surface and removing the uncured photocrosslinkable resin layer on the first surface and (g2) uncovering the first conductive layer on the periphery of the through-hole(s) on the second surface by supplying the photocrosslinkable resin removing solution from the first surface and removing the photocrosslinkable resin layer on the through-hole(s) and on the periphery of the through-hole(s) on the second surface, and the step (e) is performed between the step (g1) and the step (g2).

* * * * *